United States Patent

Tsuji et al.

[11] Patent Number: 5,804,468
[45] Date of Patent: Sep. 8, 1998

[54] PROCESS FOR MANUFACTURING A PACKAGED SEMICONDUCTOR HAVING A DIVIDED LEADFRAME STAGE

[75] Inventors: Kazuto Tsuji; Yoshiyuki Yoneda; Hideharu Sakoda; Michio Sono; Ichiro Yamaguchi; Toshio Hamano; Yoshihiro Kubota; Michio Hayakawa; Yoshihiko Ikemoto, all of Kawasaki; Yukio Saigo; Naomi Miyaji, both of Satsuma-gun, all of Japan

[73] Assignees: Fujitsu Limited, Kawasaki; Kyushu Fujitsu Electronics Limited, Kagoshima, both of Japan

[21] Appl. No.: 561,421

[22] Filed: Nov. 21, 1995

Related U.S. Application Data

[62] Division of Ser. No. 213,720, Mar. 16, 1994, Pat. No. 5,497,032.

[30] Foreign Application Priority Data

Mar. 17, 1993 [JP] Japan .................................. 5-056252
Mar. 17, 1993 [JP] Japan .................................. 5-057527
Feb. 17, 1994 [JP] Japan .................................. 6-020642

[51] Int. Cl.$^6$ .......................... H01L 21/56; H01L 21/58; H01L 21/60
[52] U.S. Cl. .......................... 438/122; 438/123; 438/124; 438/460; 438/613
[58] Field of Search .................................. 437/974, 923, 437/902, 217, 220; 148/DIG. 135

[56] References Cited

U.S. PATENT DOCUMENTS

| | | | |
|---|---|---|---|
| 4,530,152 | 7/1985 | Roche et al. ............................. | 29/588 |
| 4,884,124 | 11/1989 | Mori et al. ............................... | 257/676 |
| 5,021,865 | 6/1991 | Takahashi et al. ....................... | 257/676 |
| 5,032,543 | 7/1991 | Black et al. ............................. | 437/219 |
| 5,053,855 | 10/1991 | Michii et al. ............................ | 257/676 |
| 5,139,973 | 8/1992 | Nagy et al. ............................. | 437/902 |
| 5,172,214 | 12/1992 | Casto ..................................... | 437/902 |
| 5,175,060 | 12/1992 | Enomoto et al. ........................ | 257/676 |
| 5,245,215 | 9/1993 | Sawaya .................................. | 257/676 |
| 5,273,938 | 12/1993 | Lin et al. ................................ | 437/207 |

FOREIGN PATENT DOCUMENTS

| | | |
|---|---|---|
| 58-100447 | 6/1983 | Japan . |
| 62-276863 | 12/1987 | Japan . |
| 63-52445 | 3/1988 | Japan . |
| 63-293931 | 11/1988 | Japan . |
| 1-251748 | 10/1989 | Japan . |

*Primary Examiner*—David Graybill
*Attorney, Agent, or Firm*—Nikaido, Marmelstein, Murray & Oram LLP

[57] ABSTRACT

A process for manufacturing semiconductor device having a package in which a semiconductor device is sealed includes a base, and a metallic film is formed on a surface of the base. The semiconductor chip is formed on the metallic film. A pad formed on the semiconductor chip is connected to the metallic film by a wire. A sealing layer is formed on the metallic film. Leads are formed on the glass layer. A connecting layer is formed on the metallic film and contains electrically conductive particles. The connecting layer is in contact with a lead for a power supply system and connecting the metallic film to the lead.

4 Claims, 26 Drawing Sheets

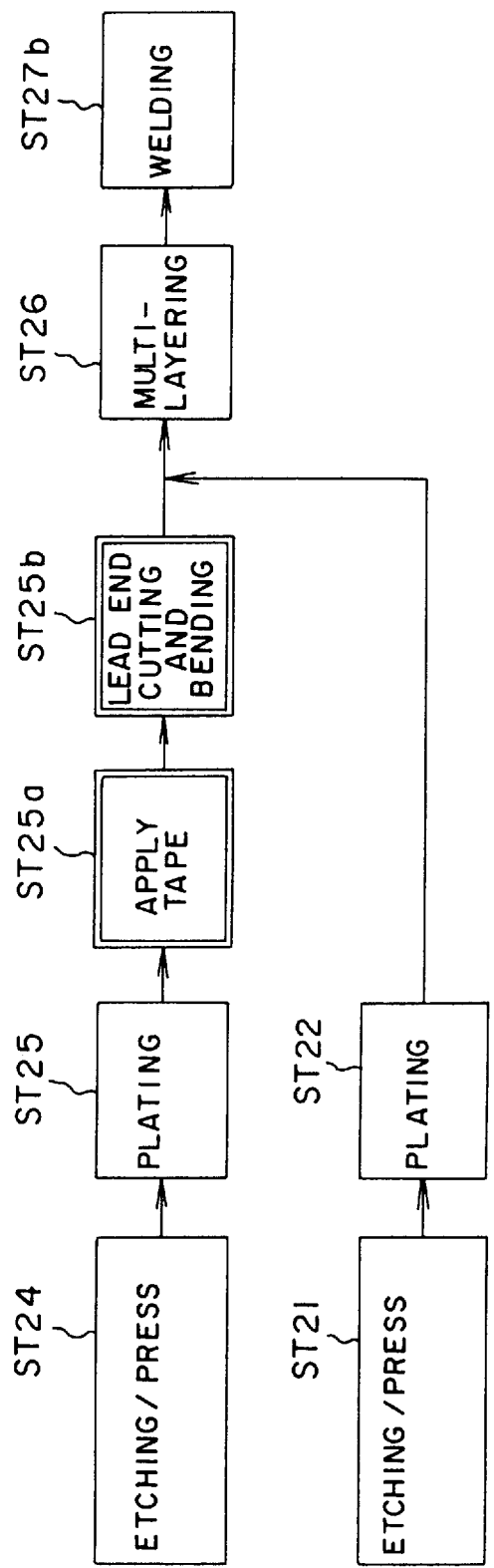

5,804,468

PROCESS FOR MANUFACTURING A PACKAGED SEMICONDUCTOR HAVING A DIVIDED LEADFRAME STAGE

This is a division of application Ser. No. 08/213,720 filed Mar. 16, 1994 U.S. Pat. No. 5,447,032.

BACKGROUND OF THE INVENTION

1. Field of the Invention

The present invention generally relates to semiconductor devices, and more particularly to a semiconductor device packaged so that a semiconductor chip and leads are electrically connected to inner lead portions and outer lead portions integral with the inner lead portions extend from a package.

As the integration density increases, a packaged semiconductor device needs an increased number of terminals or pins. Further, an increase in the integration density lengthens leads and bonding wires. As the leads and wires become long, the inductances thereof are increased. Particularly, when the semiconductor device operates at high speed, an increase in the impedance of the leads and wires causes noise superposed on power supply lines. With the above in mind, various attempts have been proposed to increase the electric characteristics related to packaging.

As is known, the electric characteristics of the packaged semiconductor devices depend on the performance of packaging. The packaging is required to obtain low inductance, low dielectric constant and low resistance characteristics.

2. Description of the Prior Art

A plastic package is widely used. FIGS. 1A and 1B show a packaged semiconductor device 11 having a plastic package. More particularly, FIG. 1A is a cross-sectional view of the plastic-packaged semiconductor device 11, and FIG. 1B is a plan view of a lead frame used in the device 11.

The semiconductor device 11 includes a semiconductor chip or element 13 mounted on a stage 12a of a single lead frame 12, which includes supporting bars 12b extending from the four corners of the lead frame 12. A predetermined number of leads 12c are provided between the adjacent supporting bars 12b. Portions of the leads 12c located inside the package after the packaging process are called inner leads 12c1, and portions thereof located outside of the package are called outer leads (not shown for the sake of simplicity). The supporting bars 12b and the leads 12c are integrally formed and supported by a supporting frame (not shown). A Ring-shaped polyimide tape 14 is attached on the leads 12c (more strictly, the inner leads 12c1).

The semiconductor chip 13 mounted on the stage 12a have electrode pads formed thereon. These pads are connected to the ends of the inner leads 12c1 by wire bonding (wires are not shown for the sake of simplicity). Then, the semiconductor chip 13 is placed in a die and packaged by a resin molding process. Thereafter, the portions of the leads 12 outside of the package are cut so as to form the outer leads having a predetermined length. Further, the supporting bars 12b are cut on a package surface 15.

The plastic packages are widely used. However, the plastic packages do not completely meet the requirements of high integration density, high operation speed and high power. Particularly, the leads 12c are long and have large inductances.

A multi-frame structure as shown in FIGS. 2A and 2B has been proposed in order to particularly reduce the inductances of a power supply system (which includes a power supply line and a ground line). More particularly, FIG. 2A shows a lead-part frame 20, and FIG. 2B is a stage-part frame 24. The lead-part frame 20 includes tie bars 22 between cradles 21. A predetermined number of leads 23a extend inward from the tie bars 22. A ring-shaped bus bar 23b is integrally provided so that the bus bar 23b places the leads 23a inside thereof. The above parts are integrally formed. The stage-part frame 24 has a stage supported by supporting bars 26a and 26b extending from cradles 25. These parts are integrally formed. A semiconductor chip 28 (pads 28a) are mounted on the stage 27 by an adhesive.

Other attempts have been proposed in order to improve the electric characteristics based on packaging.

FIG. 3A shows a conventional DIP-type semiconductor device 31A having a ceramic package. The device 31A includes a semiconductor chip 33 mounted on the bottom surface of a cavity formed in a base 32 and fixed thereto by an adhesive 34. A lead frame 36a is fixed to the base 32 by a sealing glass layer 35a. Inner leads of the lead frame 36a and the semiconductor chip 33 are electrically bonded together by wires 37. A cap 38 made of a ceramic is fixed by a sealing glass layer 35b, and the semiconductor chip 33 is hermetically sealed. Outer leads of the lead frame 36a are bent, as shown in FIG. 3A.

FIG. 3B shows a variation 31B of the semiconductor device 31A shown in FIG. 3A. The outer leads of the lead frame 36a are bent so that a gull-wing lead structure is formed. The outer leads of the lead frame 36a may be bent so that the outer leads are of an approximately J-shaped structure.

Recently, ECL (Emitter-Coupled Logic) devices, Bi-CMOS (Bipolar-Complementary Metal Oxide Semiconductor) devices, compound semiconductor devices (GaAs devices and so on), and even CMOS devices have been operated at a high frequency in the range of tens of mega-hertz (MHz) to a few giga-hertz (GHz) and have consumed a large amount of power between a few watts (W) and tens of watts. Nowadays, semiconductor chips used in the above devices have been provided in surface-mounting type ceramic packages, which utilize a stacked body made up of a plurality of alumina ceramic layers and plane layers used for power supply are formed on the alumina ceramic layers. The mutual connections between the plane layers are made by means of via holes formed in the alumina ceramic layers. Such plane layers contribute to reduction in the inductances of the power supply system and increase in the capacity of supplying power.

FIGS. 3C and 3D show a semiconductor device 31c having a ceramic package. In FIG. 3D, a cap has been removed. The semiconductor device 31c includes a surface-mounting type quad flat package (QFP) and has a two-layer Cerquad (ceramic quad) structure. An Al (aluminum) plane film 42 is formed on a ceramic base 41 by an evaporation process. A semiconductor chip 44 is mounted on the center portion of the aluminum film 42 by an adhesive 43 of silver glass. A lead frame 45 is fixed to the peripheral surface portion of the aluminum film 42 via a refractory-glass layer 46 having an opening. The semiconductor chip 44, the Al film 42 and the inner leads of the lead frame 45 are electrically connected by Al wires 47, as shown in FIG. 3C.

Further, a refractory-glass layer 46A is formed on outer portions of the inner leads of the lead frame 45, and a crystallized glass layer 48 is formed on inner portions of the inner leads. A cap 49 having a recess portion 49a corresponding to the semiconductor chip 44 is fixed by the refractory-glass layer 46A and the crystallized glass layer 48. The Al film 42 is used as a power supply layer which carries a high-potential or low-potential power supply voltage. Normally, either the high-potential or the low-potential power supply voltage is the ground level. The Al film 42 is connected to the corresponding inner leads of the lead frame 45 by the Al wires 47. The outer leads of the lead frame 45 are bent so as to have an approximately L-shaped structure. The structure shown in FIGS. 3C and 3D is called a two-layer Cerquad structure in which the Al film 42 is formed on the base 41 and the lead frame 45 is connected to the Al film 42 by the Al wires 47.

The semiconductor device shown in FIGS. 1A and 1B has a disadvantage in that the leads and wires are long and hence have large inductances. The semiconductor device shown in FIGS. 2A and 2B has disadvantages in which the multi-frame structure increases the production cost and the leads connecting the power supply systems having the power supply lines and the ground lines of the multi-frame structure to a circuit formed on a printed circuit board still have large inductances.

The semiconductor devices shown in FIGS. 3A, 3B, 3C and 3D use the bonding wires 37 and 47, which have large inductances. Particularly, the Al film 42 shown in FIGS. 3C and 3D is connected to the lead frame 45 by the Al wires which have large inductances. Further, in the structure shown in FIGS. 3C and 3D, if it is required to provide a plurality of power supply system in the semiconductor device 31c, it is necessary to provide a plurality of power supply layers which need a plurality of stacked ceramic members.

SUMMARY OF THE INVENTION

It is an object of the present invention to provide a semiconductor device in which the above disadvantages are eliminated.

A more specific object of the present invention is to provide a semiconductor device having improved electric characteristics, particularly, reduction in the inductances of a power supply system.

Another object of the present invention is provide a less-expensive semiconductor device having a plurality of power supply system.

The above objects of the present invention are achieved by a semiconductor device having a package in which a semiconductor device is sealed, the semiconductor device comprising:

a base;

a metallic film formed on a surface of the base, the semiconductor chip being formed on the metallic film, and a pad formed on the semiconductor chip being connected to the metallic film by a wire;

a sealing layer formed on the metallic film;

leads formed on the glass layer; and a connecting layer formed on the metallic film and containing electrically conductive particles, the connecting layer being in contact with a lead for a power supply system and connecting the metallic film to the lead.

The above objects of the present invention are also achieved by a semiconductor device having a package in which a semiconductor device is sealed, the semiconductor device comprising:

a base;

a metallic film formed on a surface of the base, the metallic film having a plurality of separated areas, the semiconductor chip being formed on one of the plurality of separated areas;

a sealing layer formed on the metallic film;

leads formed on the glass layer; and wires connecting pads formed on the semiconductor chip to leads and the plurality of separated areas and connecting the leads to the plurality of separated areas.

The above objects of the present invention are also achieved by a semiconductor device having a package in which a semiconductor device is sealed, the semiconductor device comprising:

a stage having a plurality of separated areas, the semiconductor chip being formed on one of the plurality of separated areas, the separated areas being supported by resin of the package, a back surface of the stage opposite to a surface thereof on which the semiconductor chip is mounted being exposed from the package, the stage comprising an electrically conductive material;

leads extending from the package; and wires connecting pads formed on the semiconductor chip to the leads and the separated areas.

A yet another object of the present invention is to provide a lead frame suitable for the above-mentioned semiconductor device.

This object of the present invention is achieved by a lead frame for a packaged semiconductor device, comprising:

a stage having a surface on which a semiconductor chip is mounted; and leads having inner lead portions and outer lead portions, the stage having grooves formed on the surface of the stage, the grooves defining the stage into divided areas each other in a state in which the lead frame is provided in the packaged semiconductor device.

A further object of the present invention is to provide a method of producing the above-mentioned semiconductor device.

This object of the present invention is achieved by a method of producing a semiconductor device, comprising the steps of:

(a) mounting a semiconductor chip on a first surface of a stage of a lead frame, the stage having grooves formed on the first surface of the stage, (b) establishing electric connections between the semiconductor chip, the stage and the leads;

(c) forming a package which seals the semiconductor chip;

(d) removing a surface of the package so that a second surface of the stage opposite to the first surface appears so that the areas of the stage are separated from each other.

BRIEF DESCRIPTION OF THE DRAWINGS

Other objects, features and advantages of the present invention will become more apparent from the following detailed description when read in conjunction with the accompanying drawings, in which:

FIG. 28 is a diagram of a method of producing the semiconductor device shown in FIGS. 27A and 27B;

DESCRIPTION OF THE PREFERRED EMBODIMENTS

Figure 1A:
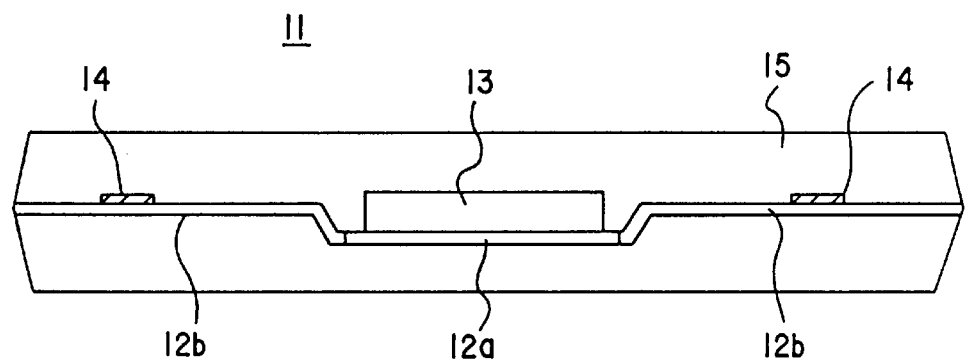
FIGS. 1A and 1B are diagrams of a conventional semiconductor device having a plastic package.
Figure 1B:
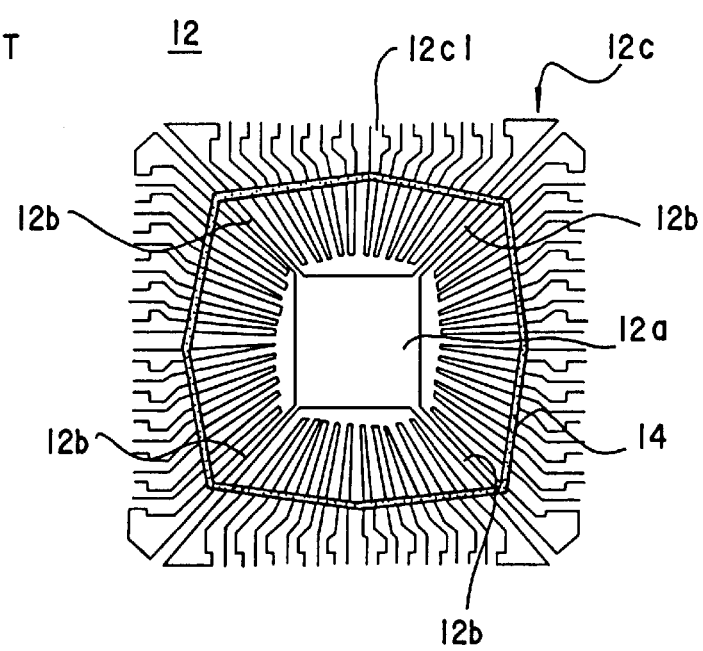
Figure 2A:
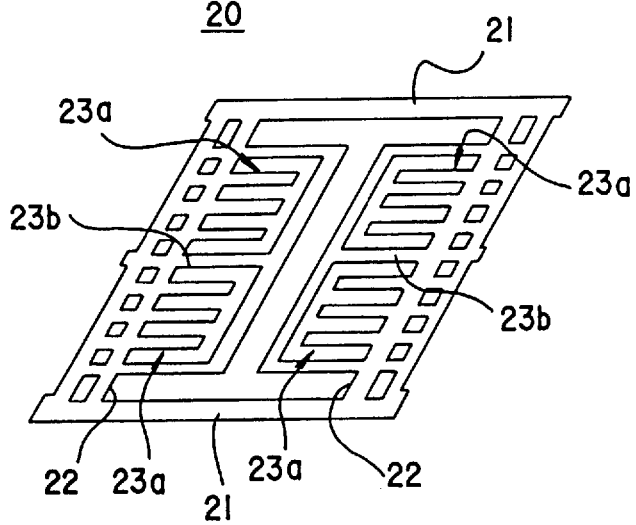
FIGS. 2A and 2B are perspective views of a conventional multi-layer frame structure.
Figure 2B:
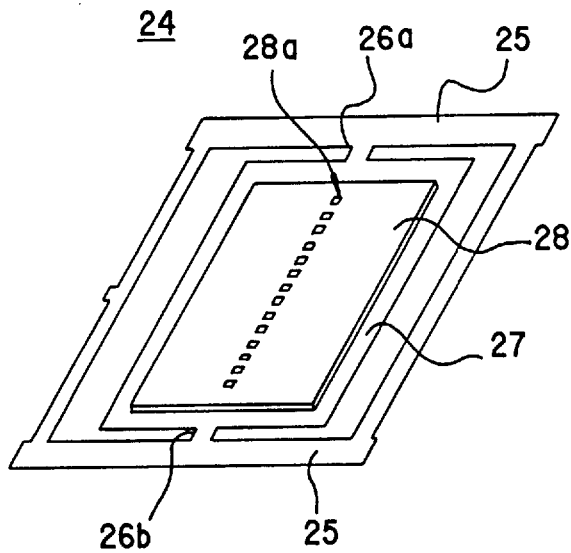
Figure 3A:
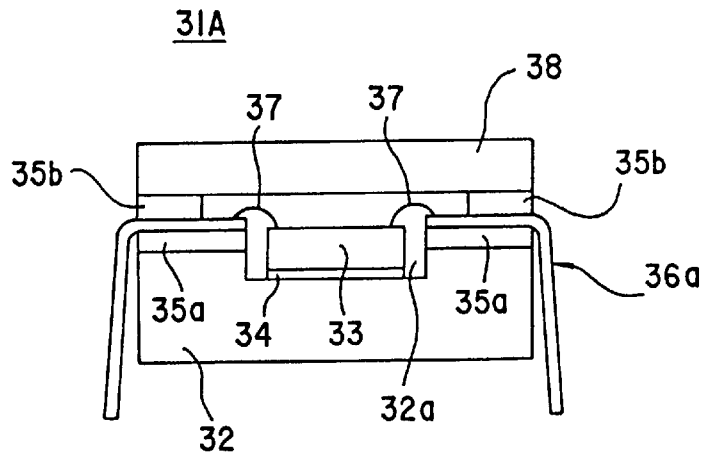
FIG. 3A is a cross-sectional view of a first conventional semiconductor device having a ceramic package.
Figure 3B:
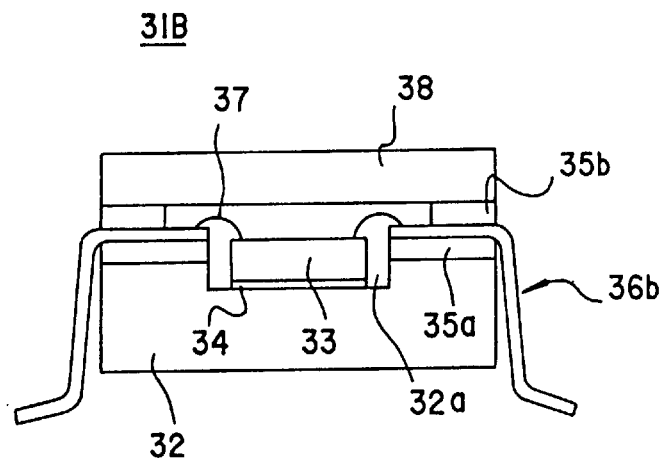
FIG. 3B is a cross-sectional view of a second conventional semiconductor device having a ceramic package.
Figure 3C:
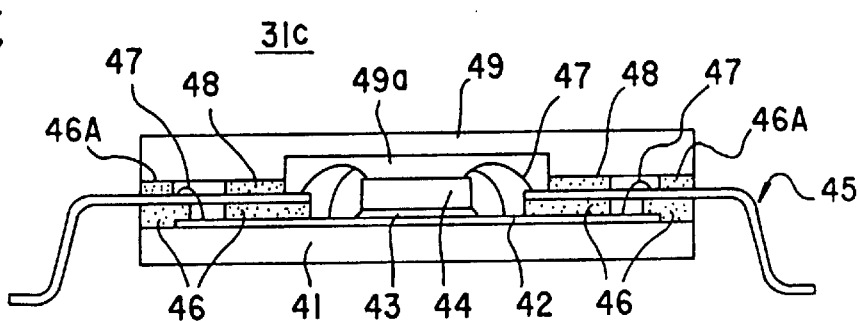
FIG. 3C is a cross-sectional view of a third conventional semiconductor device having a ceramic package.
Figure 3D:
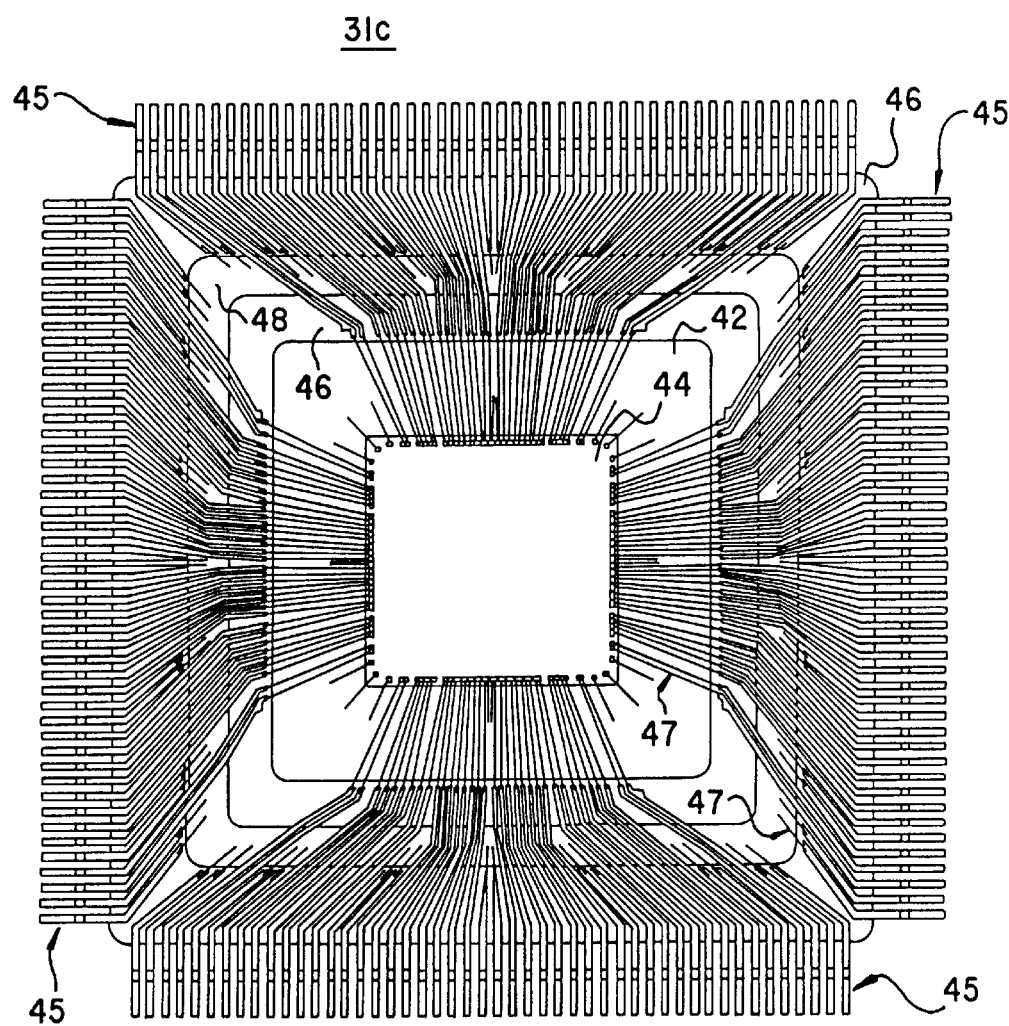
FIG. 3D is a plan view of the third conventional semiconductor device with a cap removed.
Figure 4:
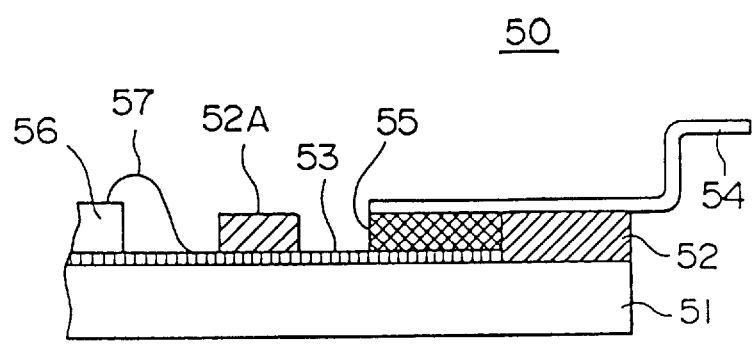
FIG. 4 is a cross-sectional view of a semiconductor device according to a first embodiment of the present invention.
Figure 5:
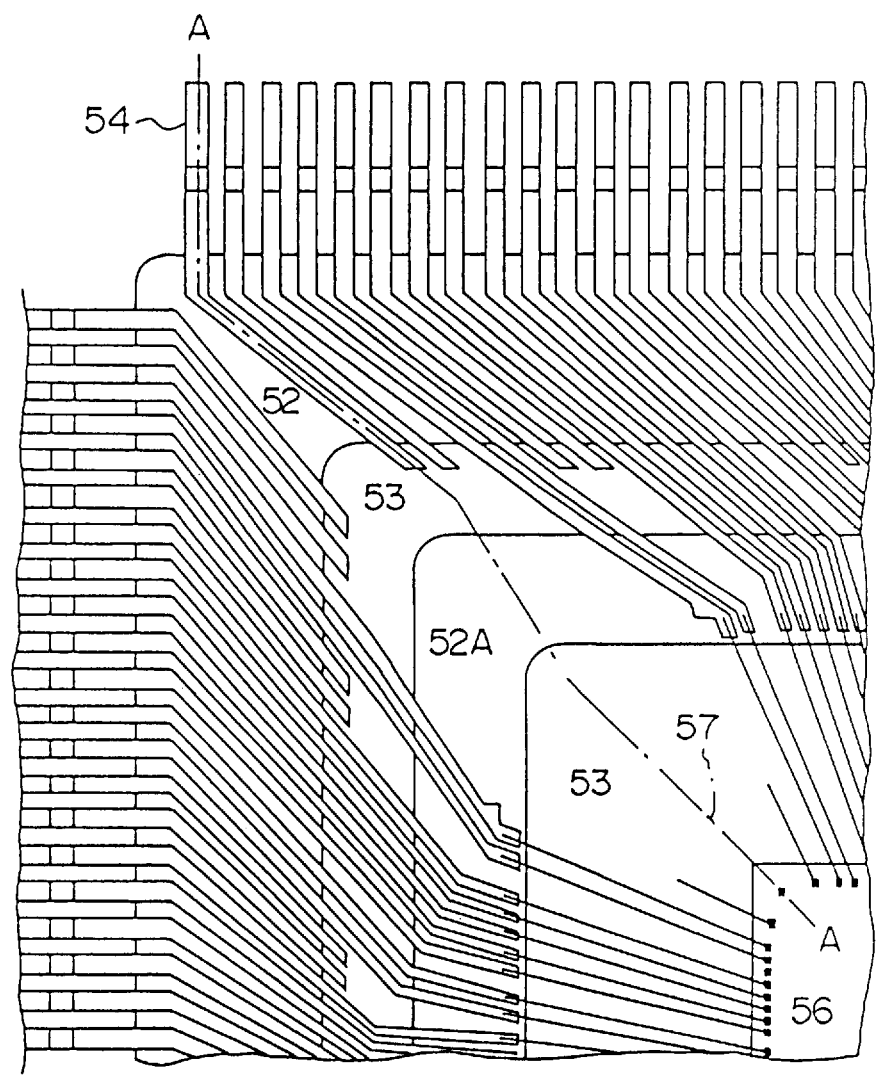
FIG. 5 is a plan view of a part of the semiconductor device shown in FIG. 4.

FIGS. 4 and 5 are diagrams of a semiconductor device 60 according to a first embodiment of the present invention. More particularly, FIG. 4 is a cross-sectional view taken along line A—A shown in FIG. 5. In FIGS. 4 and 5, a cap like the cap 49 shown in FIG. 3C is omitted. The semiconductor device 60 has a two-layer Cerquad package. An Al plane film 53 for the power supply system is formed on the almost entire surface of a ceramic base 51 by an evaporation process. The ceramic base 51 is made of, for example, alumina or aluminum nitride (AlN), the latter having a good heat radiating characteristic. The Al plane film 53 carries a high-potential or a low-potential power supply line (for example, a ground line). A refractory-glass layer 52 is formed on a peripheral surface portion of the ceramic base 51 so as to form a ring-shaped layer. The refractory-glass layer 52 supports a lead frame 54 used for the power supply system. An Al film (not shown) is formed on the Al-deposited lower portion of the lead frame 54 by the evaporation process. The height of the refractory-glass layer 52 is higher than that of the Al plane film 53. A glass layer 55 containing electrically conductive particles such as Ag glass or Al glass is provided in a space defined by the Al film 53, the refractory-glass layer 52 and the lead frame 54, and joins the lead frame 54 and the Al film 53 together. The Al-deposited lower portion of the lead frame 54 adhere to the glass layer 55 very well. A ring-shaped refractory-glass layer 52A is formed on the Al film 53 and located outside of a semiconductor chip 56 mounted on the Al film 53. A wire 57, which is provided by a wire bonding process, electrically connects the Al film 53 and a pad formed on the semiconductor chip 56.

The glass layer 55 containing the electrically conductive particles is coated on the Al film 53 by a normal screen printing process or a dispense process. The conductive glass layer 55 is obtained by mixing, for example, 50 wt % Ag or Al particles with crystallized glass. Each Ag or Al particle has a diameter between 10 $\mu$m$\phi$ and 20 $\mu$m$\phi$.

A large area of the lead frame 54 is in contact with the conductive glass layer 55 formed on the Al plane film 53. Hence, the inductances of the connecting portion can be greatly reduced and becomes much less than that of the connecting portion utilizing the bonding wire (wire 47 shown in FIG. 3C).

Figure 6:
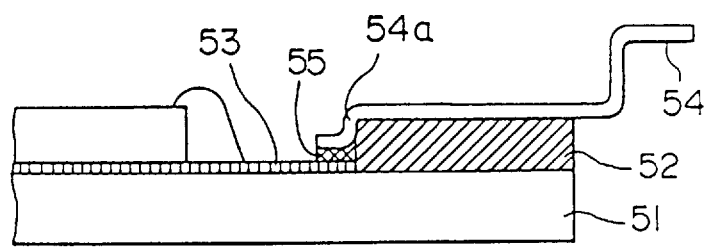
FIG. 6 is a cross-sectional view of a semiconductor device according to a first variation of the structure shown in FIG. 4.

FIG. 6 shows a first variation of the semiconductor device 50 shown in FIG. 4. In FIG. 6, parts that are the same as those shown in FIG. 4 are given the same reference numbers as previously, and a cap is omitted. FIG. 6 corresponds to a cross-sectional view taken along the line A—A shown in FIG. 5. The lead frame 54 has a bent end portion 54a close to the Al plane film 53. An Al film deposited on the lower joining portion of the bent end portion 54a adheres to the conductive glass layer 55, which adheres to the Al layer 55. Since the bent end portion of the lead frame 54 is closer to the Al film 53 than the straight joining portion thereof shown in FIG. 4, the resistance of the connecting portion is less than that of the connecting portion shown in FIG. 4.

Figure 7:
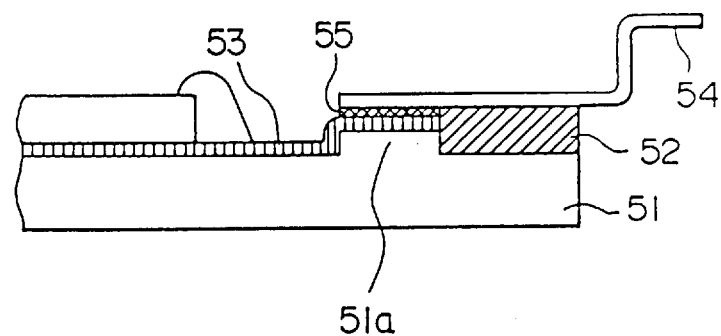
FIG. 7 is a cross-sectional view of a semiconductor device according to a second variation of the structure shown in FIG. 4.

FIG. 7 shows a second variation of the semiconductor device 50 shown in FIG. 4. In FIG. 7, parts that are the same as those shown in FIG. 4 are given the same reference numbers as previously, and a cap is omitted. FIG. 7 corresponds to a cross-sectional view taken along the line A—A shown in FIG. 5. The base 51 has a projection 51a close to the refractory-glass layer 52. The Al film 53 is deposited on the projection 51a, whereby the straight joining portion of the lead frame 54 becomes close to the Al plane film 53 An Al film deposited on the lower joining portion of the lead frame 54 adheres to the conductive glass layer 55, which adheres to the portion of the Al layer 55 formed on the projection 51a. Since the straight joining portion of the lead frame 54 is closer to the Al film 53 than that of the lead frame 54 shown in FIG. 4, the resistance of the connecting portion is less than that of the connecting portion shown in FIG. 4.

Figure 8:
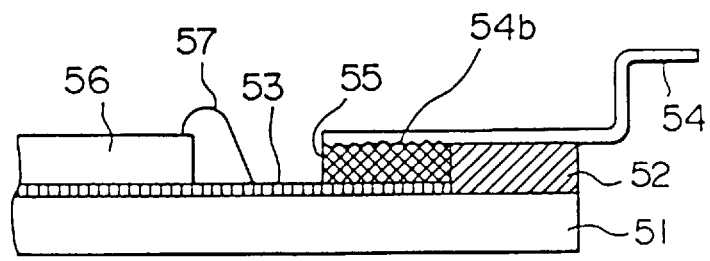
FIG. 8 is a cross-sectional view of a semiconductor device according to a third variation of the structure shown in FIG. 4.

FIG. 8 shows a third variation of the semiconductor device 50 shown in FIG. 4. In FIG. 8, parts that are the same as those shown in FIG. 4 are given the same reference numbers as previously, and a cap is omitted. The joining portion of the lead frame 54 has a rough surface 54b, which increases the adhesive strength to the glass layer 55. The lead frame 54 is masked except for the joining portion and the rough surface 54b is formed by a sand blasting process.

Figure 9:
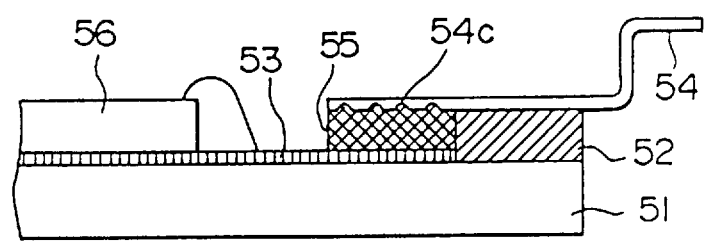
FIG. 9 is a cross-sectional view of a semiconductor device according to a fourth variation of the structure shown in FIG. 4.

FIG. 9 shows a fourth variation of the semiconductor device 50 shown in FIG. 4. In FIG. 9, parts that are the same as those shown in FIG. 4 are given the same reference numbers as previously, and a cap is omitted. A plurality of dimples 54c are formed on the lower joining portion of the lead frame 54. For example, each of the dimples 54c has a diameter of 0.1 mm$\phi$, and a depth of 30 $\mu$m. The dimples 54c increases the adhesive strength to the glass layer 55.

Figure 10:
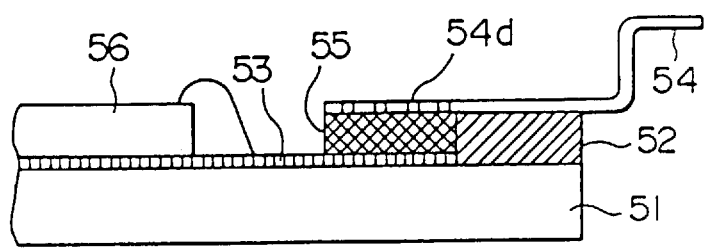
FIG. 10 is a cross-sectional view of a semiconductor device according to a fifth variation of the structure shown in FIG. 4.

FIG. 10 shows a fifth variation of the semiconductor device 50 shown in FIG. 4. In FIG. 10, parts that are the same as those shown in FIG. 4 are given the same reference numbers, and a cap is omitted. A plurality of through holes 54d are formed in the straight joining portion of the lead frame 54 in order to increase the adhesive strength to the glass layer 55. For example, each of the holes 54d has a diameter of 0.1 mm$\phi$.

When the base 51 includes a plurality of stacked ceramic members and a plurality of power supply lines are formed thereon, glass containing electrically conductive particles can be used to electrically connect the power supply lines by filling via holes formed in the stacked ceramic members with glass.

Figure 11A:
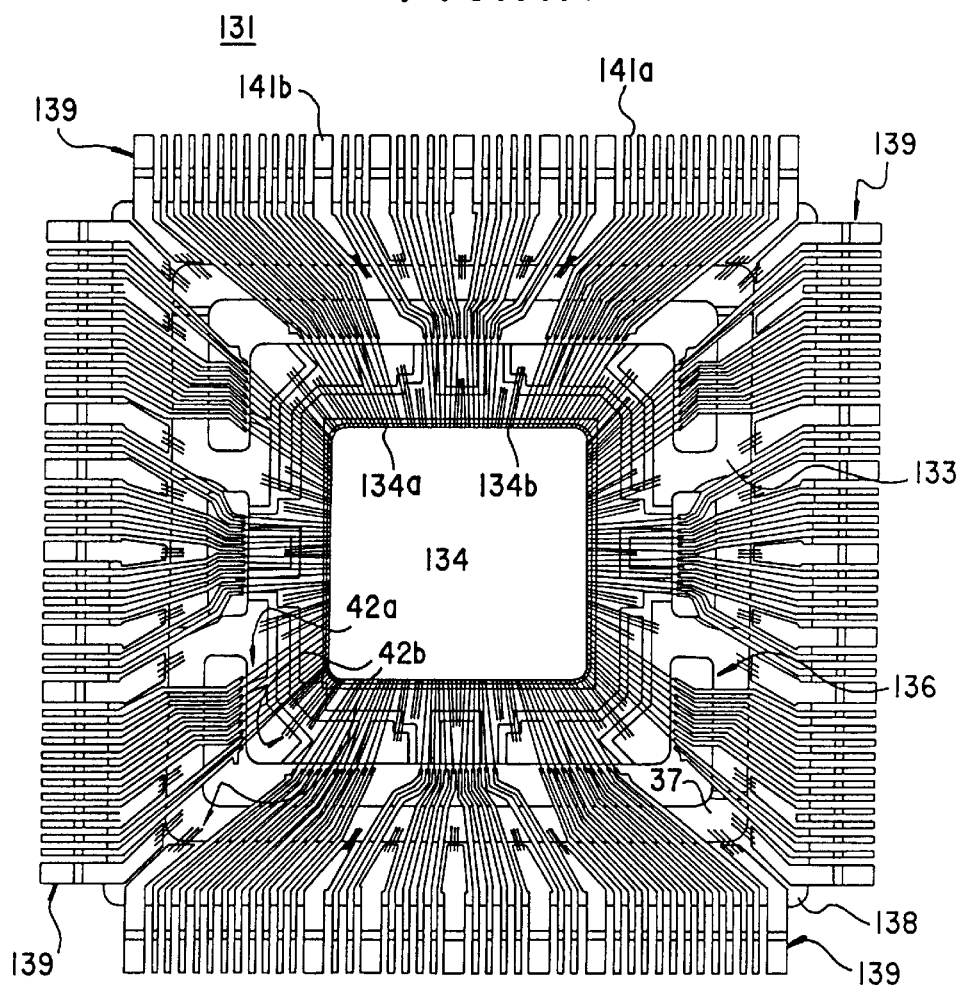
FIG. 11A is a plan view of a semiconductor device according to a second embodiment of the present invention.
Figure 11B:
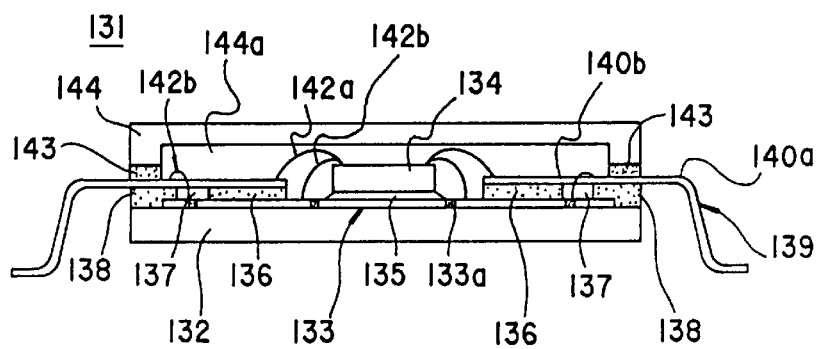
FIG. 11B is a cross-sectional view of the semiconductor device according to the second embodiment of the present invention.

FIGS. 11A and 11B show a semiconductor device 131 according to a second embodiment of the present invention. More particularly, FIG. 11A is a plan view of the semiconductor device 131 with a cap removed, and FIG. 11B is a cross-sectional view thereof. The semiconductor device 131 shown in FIGS. 11A and 11B is of the two-layer Cerquad structure type.

Figure 12A:
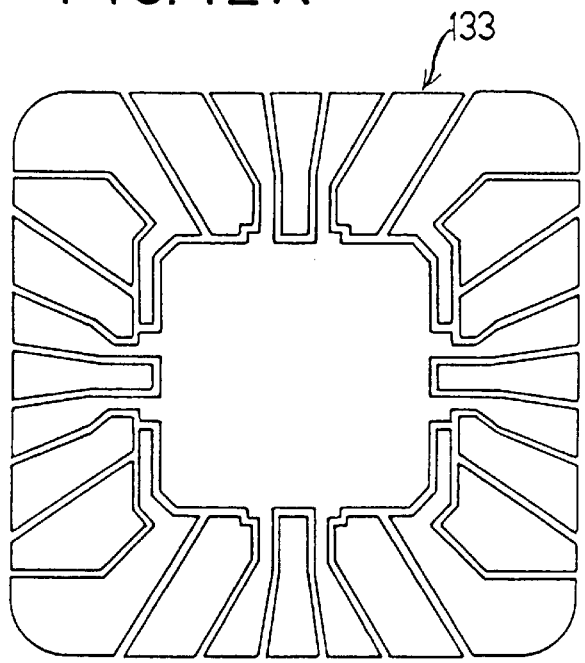
FIG. 12A is a plan view of a metallic plane film formed on a ceramic base shown in FIG. 11B.

A metallic film 133 is formed on a base 132 made of a ceramic member such as alumina or aluminum nitride. The metallic film 133 is made of aluminum and is formed by a thick-film printing process or a mask evaporation process. The metallic film 133 includes a plurality of divided parts, as shown in FIG. 12A, in which the metallic film 133 is divided into 21 parts which are symmetrical about a straight line. Each of the divided parts functions as either a high-potential power supply voltage layer or a low-potential power supply voltage layer (for example, a ground (GND) layer).

Figure 12B:
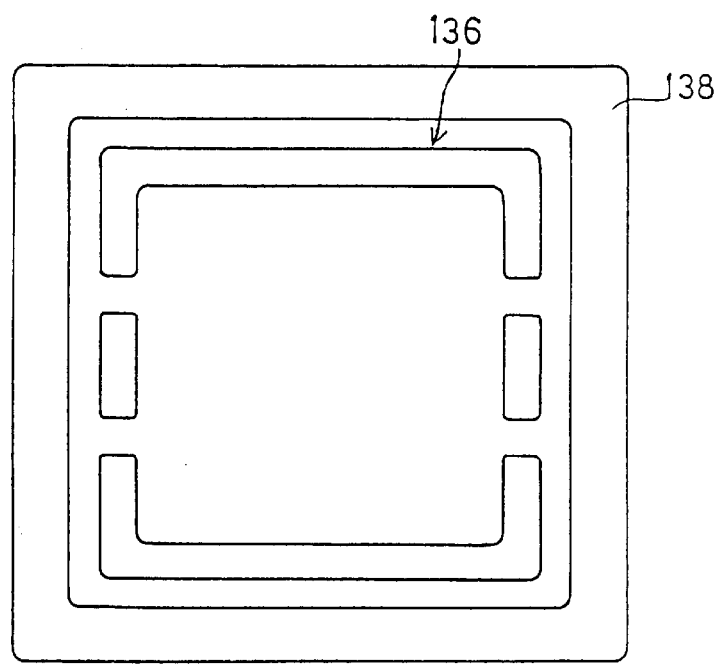
FIG. 12B is a plan view of a refractory-glass layer used in the semiconductor device according to the second embodiment of the present invention.

A semiconductor chip 134 is mounted on and fixed to the center part of the metallic film 133 by an adhesive 135 made of, for example, Au—Si eutectic or Ag glass. As shown in FIG. 12B, a crystalline refractory-glass pattern or layer 136 having divided parts (areas) is formed around the semiconductor chip 134, and openings 137 for wire bonding are provided. Further, an amorphous refractory-glass layer 138 is formed on the peripheral surface portion on the base 132 and is located around the openings 137. A metallic lead frame 139 having, for example, 164 pins is mounted on the crystalline refractory-glass layer 136 and the amorphous refractory-glass layer 138.

The lead frame 139 includes outer leads 140a extending outside of the package, and inner leads 140b located inside the package. Further, the lead frame 139 includes signal-system leads 141a and power-supply-system leads 141b. The signal-system leads 141a, which are relatively narrow, extend over the refractory-glass layers 136 and 138, and reach the semiconductor chip 134. The power-supply-system leads 141b, which are broader than and shorter than the signal-system leads 141a, extend on the refractory-glass layer 138.

The lead frame 139 is made of, for example, a Fe—Ni alloy or Cu alloy, and Al films (which do not appear in the drawings) are formed, by an evaporation process, on opposite surface portions of the leads 141a and 141b which are scheduled to contact with the refractory-glass layer 138 (143) and to be bonded to wires. The above Al films facilitate to adhere to the refractory-glass layer 138 (143). This is very effective particularly when a cap is mounted on a narrow refractory-glass portion.

On the semiconductor chip 134, provided are pads 134a for the signal system and 134b for the power supply system. The pads 134a for the signal system and the inner leads 140b of the lead frame 139 are bonded by Al wires 142a having a diameter of, for example, 30 $\mu$m. A plurality of Al bonding wires 142b having an identical diameter are used to connect one pad 134b for the power supply system and one divided part of the metallic film 133. In the structure shown in FIG.

11A, three Al wires 142*b* are used for the above connection. The above wire bonding is carried out for each of the other power-supply-system pads on the semiconductor device 134. Further, one power-supply-system lead 141*b* (which is an inner leads) and one divided part of the metallic film 133 are connected by a plurality of Al bonding wires 142*b* (three wires in the structure shown in FIG. 11A) extending in one opening 137. The above wire bonding is carried out for each of the other power-supply-system leads. It is preferable that the wires 142*b* are equal to or shorter than the wires 142*a*. As has been described previously, the bonding (joining) surface portions of the inner leads 140*b* are coated with the Al metallic film, which facilitates to improve the performance of the bonding using the wires 142*a* and 142*b*.

An amorphous refractory-glass layer 143 is coated on the outermost periphery of the inner leads 140*b*, as shown in FIGS. 11A and 11B. A cap 144 having a recess portion 144*a* is fixed to the refractory-glass layer 143. The cap 114 is made of a ceramic material such as alumina or mullite, so that the semiconductor chip 134 is hermetically sealed.

Figure 13:
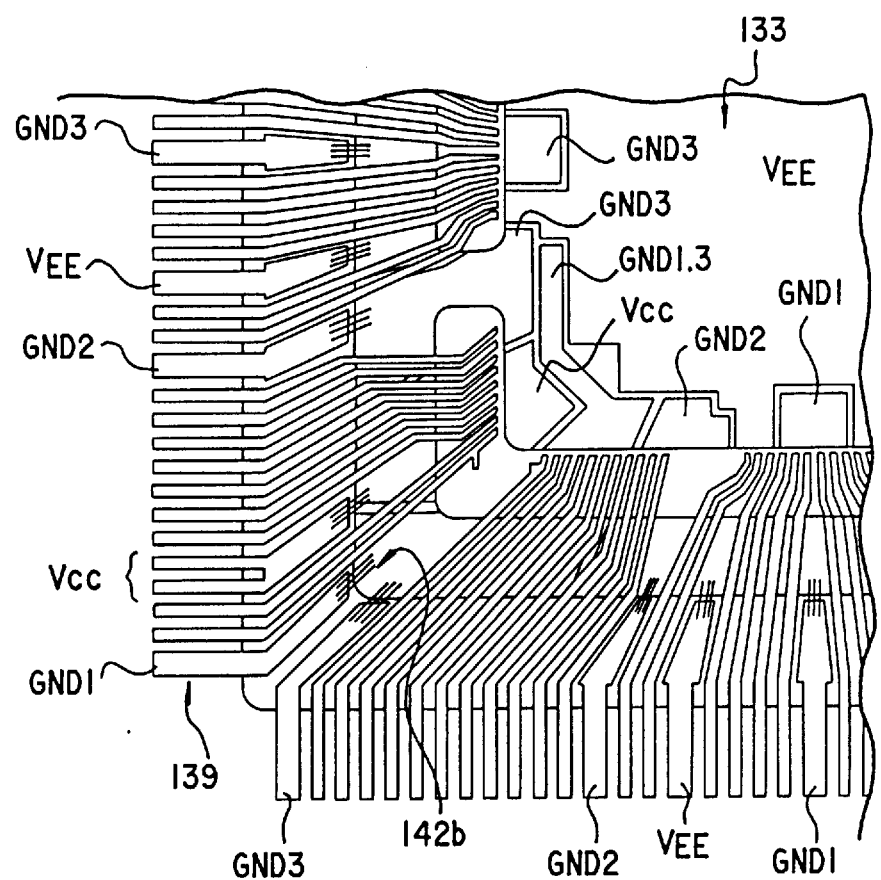
FIG. 13 is a plan view of a part of the semiconductor device shown in FIGS. 11A and 11B with a cap removed.

FIG. 13 shows the division of the metallic film 133. As shown in FIG. 13, the metallic film 133 is divided into two power supply areas $V_{EE}$ and $V_{CC}$, and three ground areas GND1, GND2 and GND3. The area GND1.3 defined by combining the ground areas GND1 and GND3 together has an end portion extending in the vicinity of the semiconductor chip 134 mounted on the center power supply area $V_{EE}$. The same areas as the area GND1.3 shown in FIG. 13 is formed in each of the other three corners of the metallic film 133. With the above formation, it becomes easy to make connections with the power supply pads and ground pads 134*b* on the semiconductor chip 134 by means of the wires 142*b* even when these pads are located away from the metallic film 133. Further, it becomes possible to provide a plurality of power supply systems (two systems in the structure shown in FIG. 13) by the metallic plane film 133 rather than a multi-layer base in which the base consists of a plurality of stacked ceramic members. Of course, the inductances of the power supply system can be reduced.

The power-supply-system leads 141*b* of the lead frame 139 and the power supply areas $V_{EE}$ and $V_{CC}$ and the ground areas GND1–GND3 are each connected by a plurality of wires 142*b* (in the example being considered, three wires are used to connect one power-supply-system lead and one power-supply-system area of the metallic film 133. Further, as shown in FIGS. 11A and 11B, the above areas and the relative pads 134*b* are connected together by a plurality of wires 142*b* (in the example being considered, three wires are used to connect one power-supply-system lead and one pad 134*b*.

It is possible to replace the refractory-glass layer 136 by a refractory-glass layer containing electrically conductive particles used in the first embodiment of the present invention and the variations thereof.

Figure 14:
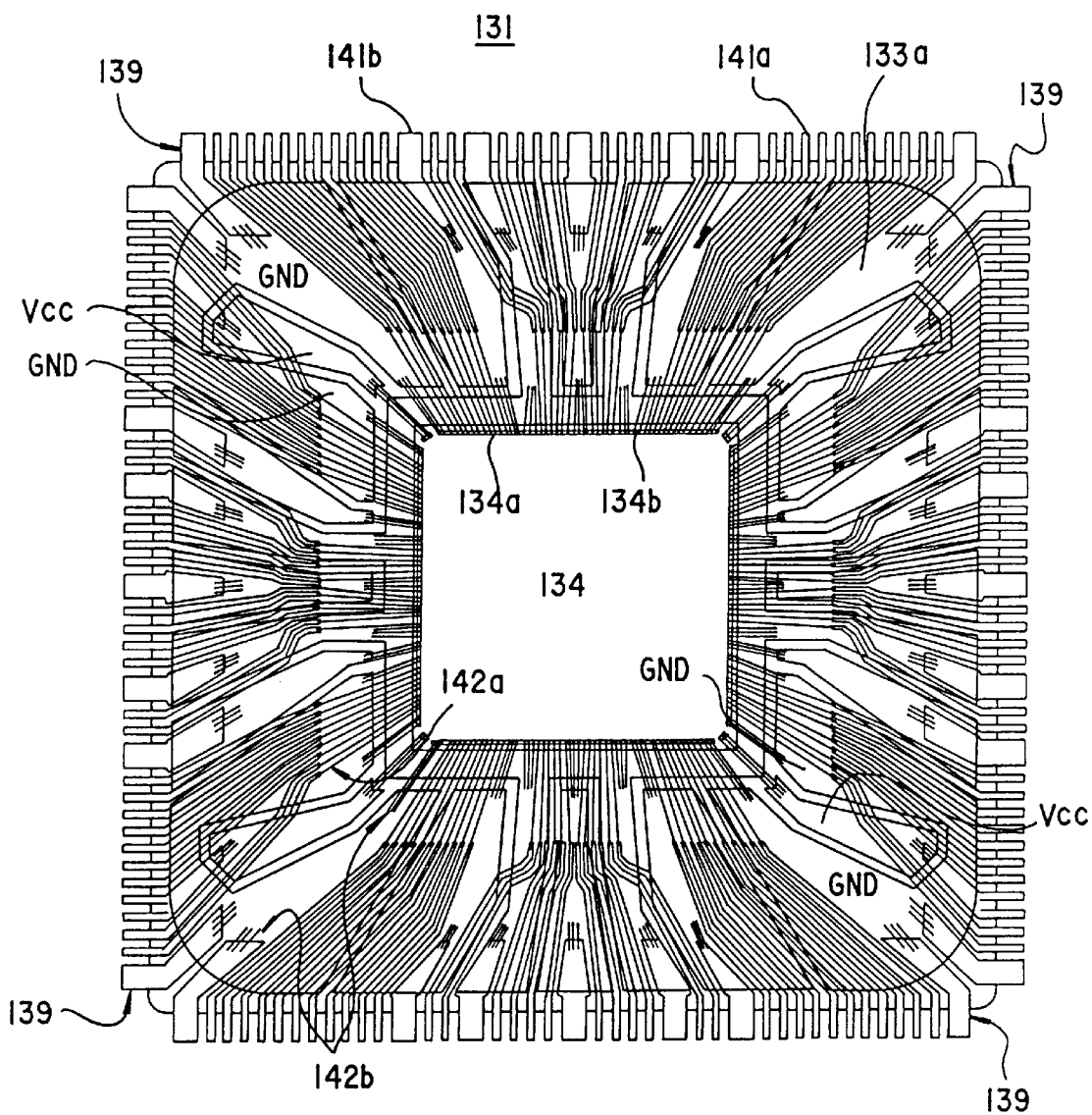
FIG. 14 is a plan view of a semiconductor device with a cap removed according to a first variation of the second embodiment of the present invention.

FIG. 14 shows a first variation of the above-mentioned structure shown in FIGS. 11A through 13. In FIG. 14, parts that are the same as those shown in FIGS. 11A through 13 are given the same reference numbers as previously, and the refractory-glass layers 136 and 138 are omitted. The first variation shown in FIG. 14 has a pattern of divided areas of the metallic film 133 different from the pattern shown in FIGS. 12A and 13. The pattern shown in FIG. 14 is formed so that the divided areas set at the same potential is located in the divided areas having the different potential. In the pattern shown in FIG. 14, each of the areas set at the potential $V_{CC}$ is located in a corresponding one of the areas set at the potential GND. The above arrangement facilitates bonding of the wires 142*b* even in a case where the power supply pads and ground pads 134*b* on the semiconductor chip 134 are located away from the metallic film 133. Further, it becomes possible to provide a plurality of power supply systems (two systems in the structure shown in FIG. 13) by the metallic plane film 133 rather than a multi-layer base in which the base consists of a plurality of stacked ceramic members. Of course, the inductances of the power supply system can be reduced.

Figure 15:
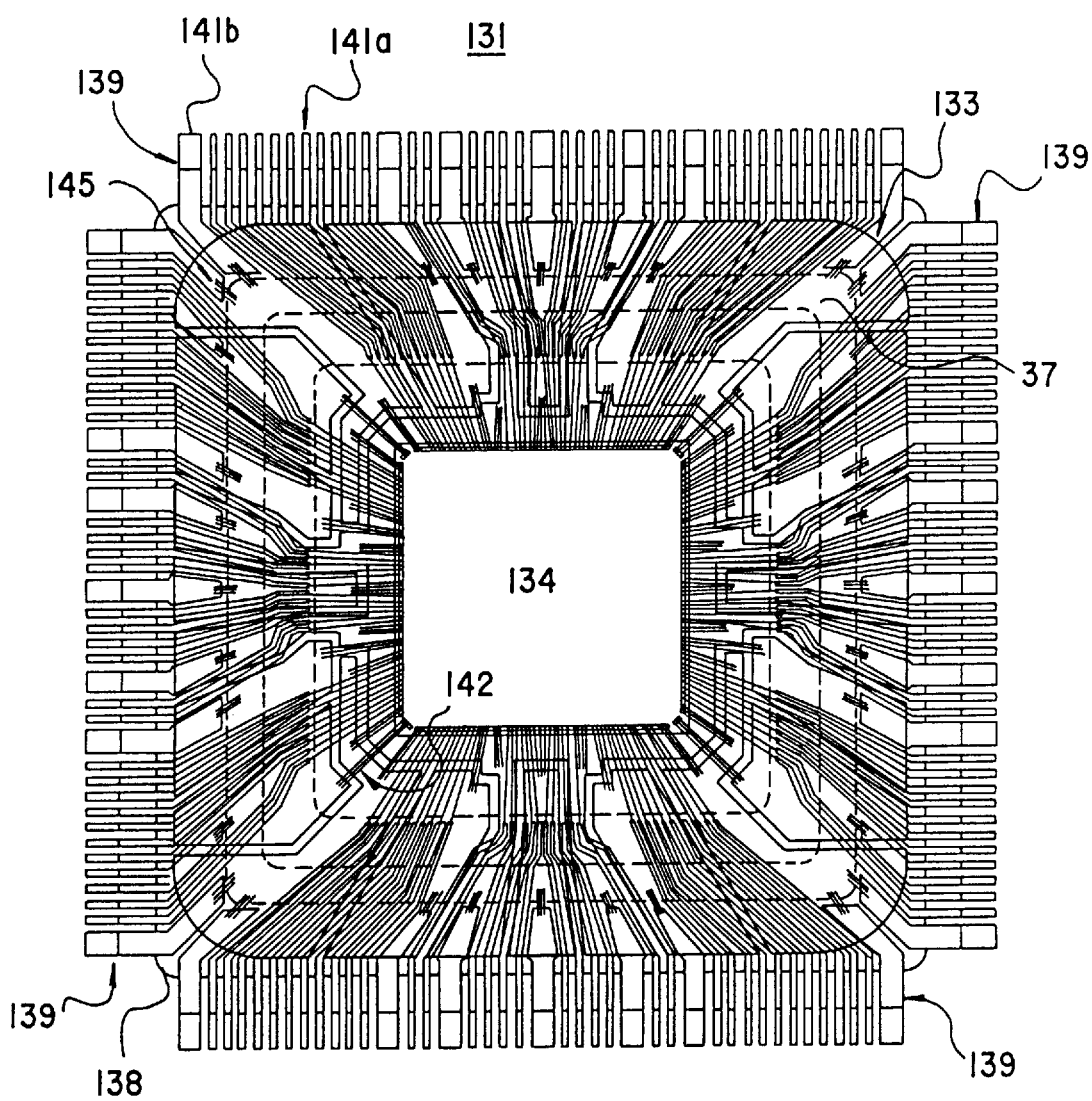
FIG. 15 is a plan view of a semiconductor device with a cap removed according to a second variation of the second embodiment of the present invention.

FIG. 15 shows a second variation of the above-mentioned structure shown in FIGS. 11A through 13. In FIG. 15, parts that are the same as those shown in FIGS. 11A through 13 are given the same reference numbers as previously, and the refractory-glass layers 136 and 138 are omitted. The power-supply-system inner leads 140*b* are connected to the relevant divided areas of the metallic film 133 by means of thick wires 145 extending in the openings 137. For example, the thick wires 145 have a diameter between 50 $\mu$m and 70 $\mu$m. Each of the thick wires 145 is used instead of the plurality of (three) wires 142*b*. The second variation has the same advantages as the aforementioned second embodiment and the first variation thereof.

Figure 16:
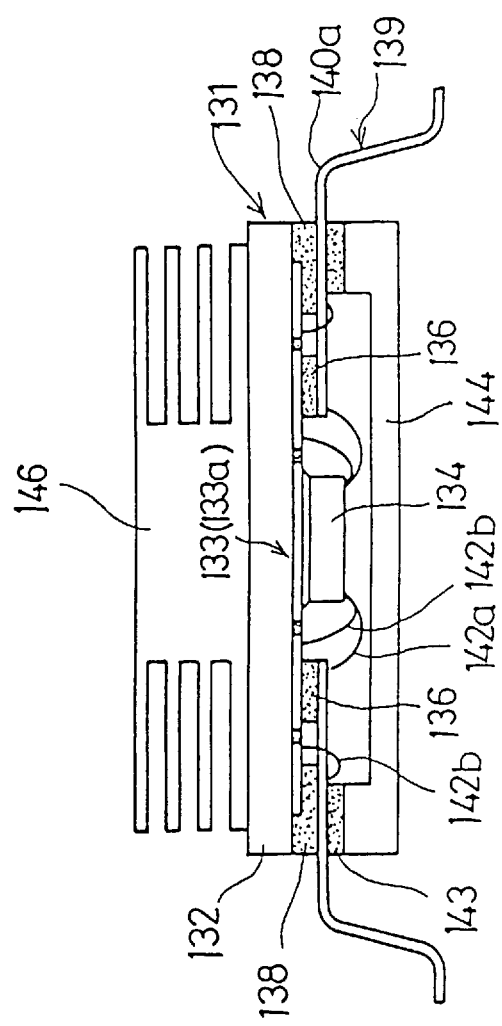
FIG. 16 is a cross-sectional view of a semiconductor device according to a third variation of the second embodiment of the present invention.

FIG. 16 shows a third variation of the above-mentioned structure shown in FIGS. 11A through 13. In FIG. 16, parts that are the same as those shown in FIGS. 11A through 13 are given the same reference numbers as previously. The outer leads 140*a* shown in FIG. 16 are bent in the direction reverse to the direction shown in FIG. 11B. The main surface of the semiconductor chip 134 on which the pads are arranged faces down. A heat radiating fin 146 made of, for example, aluminum is mounted on the surface of the base 131. If a high heat radiating effect is required, the structure shown in FIG. 16 will be useful.

The base 132 used in the second embodiment of the present invention and the first through third variations is a bulk of a ceramic material. However, the base 132 can be made up of a plurality of stacked ceramic members and patterns sandwiched therebetween. Further, inner leads can be stacked via refractory-glass layers so that a multi-layer inner lead structure can be formed.

Figure 17A:
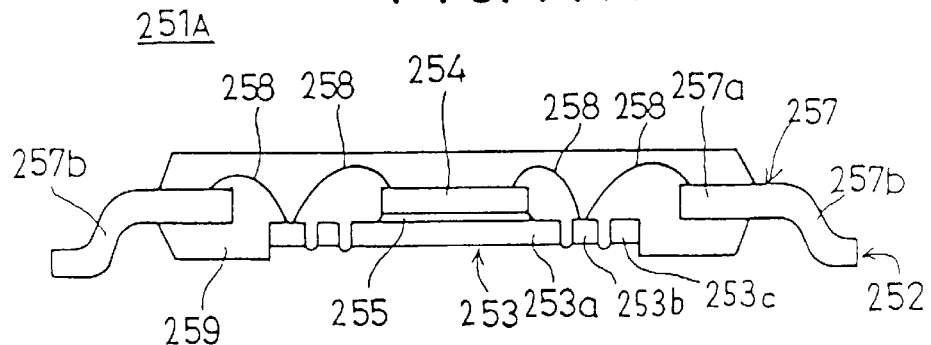
FIG. 17A is a cross-sectional view of a semiconductor device according to a third embodiment of the present invention.
Figure 17B:
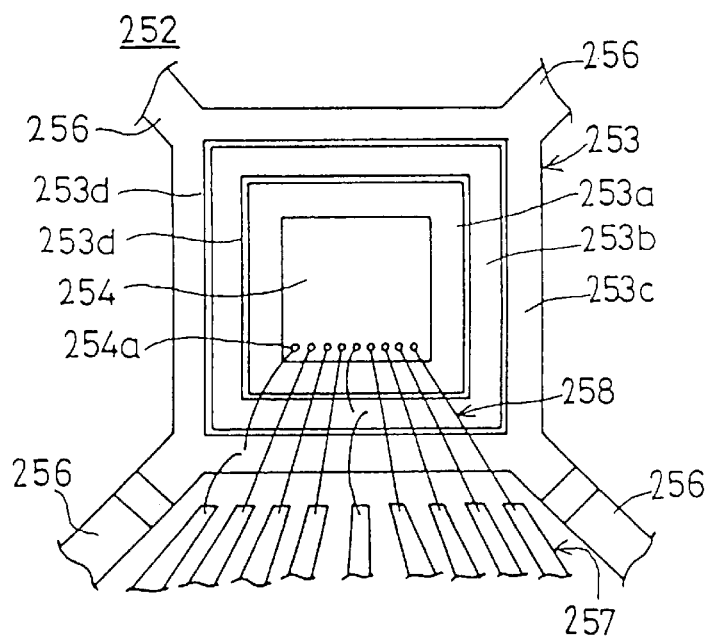
FIG. 17B is a plan view of a lead frame used in the semiconductor device shown in FIG. 17A.

A description will now be given, with reference to FIGS. 17A, 17B and 17C, of a semiconductor device 251A according to a third embodiment of the present invention. More particularly, FIG. 17A is a cross-sectional view of the semiconductor device 251A, FIG. 17B is an enlarged plan view of a stage part of a lead frame, and FIG. 17C is a cross-sectional view for explaining a state in which the back surface of the stage part is externally exposed.

The semiconductor device 251A is of the QFP type, and includes a lead frame 252 having a stage 253 including a first area 253*a* located in the center of the stage 253, a second area 253*b* located outside of the first area 253*a*, and a third area 253*c* located outside of the second area 253*b*. That is, the areas 253*a*, 253*b* and 253*c* are concentrically arranged. A semiconductor chip 254, on which pads 254*a* are formed, is mounted on and fixed to the first area 253*a* by an adhesive 255 such as silver (Ag) paste. The second area 253*b* is used as a ground layer (or a power supply layer), and the third layer 253*c* is used as a power supply layer (or a ground layer).

A predetermined number of inner portions (inner leads) 257*a* of leads 257 is arranged between supporting bars 256 which support the stage 253 and is arranged in the vicinity of the stage 253. The lead frame 252 includes the stage 253 and the leads 257, which are integrally formed. Wires 258 connect the inner leads 257a to the pads 254a formed on the semiconductor chip 254 and the second and third areas 253b and 253c, and connect the pads 254a to the second and third areas 253b and 253c. The wires 258 are provided by a wire bonding process. A package 259 is formed so that outer portions (outer leads) 257b of the leads 257 extend outward, and the back surface of the stage 253 opposite to the surface on which the semiconductor chip 254 is mounted is externally exposed. The outer leads 257b are bent in a gull-wing shape for surface mounting. An SnNi film is plated on the surfaces of the outer leads 257b, and functions as a protection member which improves the anti-etching performance in the step of producing the lead frame 252. Further, a solder film is plated on the SnNi film.

Figure 17C:
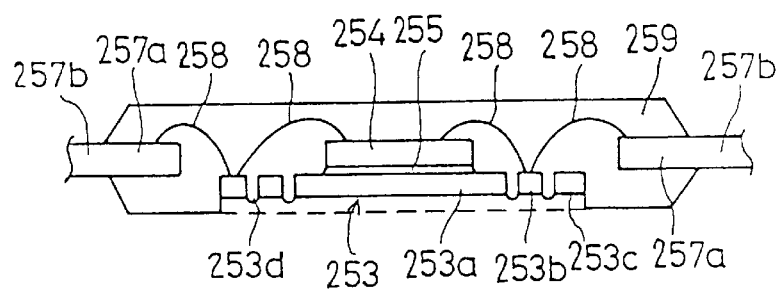
FIG. 17C is a cross-sectional view of the semiconductor device shown in FIG. 17A, in which a process of partially removing a package so that the back surface of a stage appears is shown.

As shown in FIG. 17C, at the time of forming the package 259, the back surface of the stage 253 in which grooves 253d are formed is exposed from the package 259. After the packaging process, the back surface portion of the stage 253 is removed by honing and etching processes until the grooves 253d appear and the first through third areas 253a–253c of the stage 253 appear.

Figure 18A:
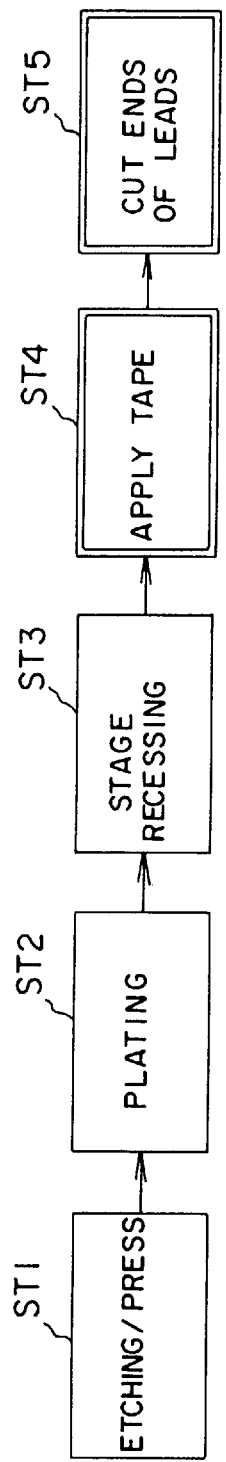
FIGS. 18A and 18B are diagrams of a method of producing the semiconductor device according to the third embodiment of the present invention.
Figure 18B:
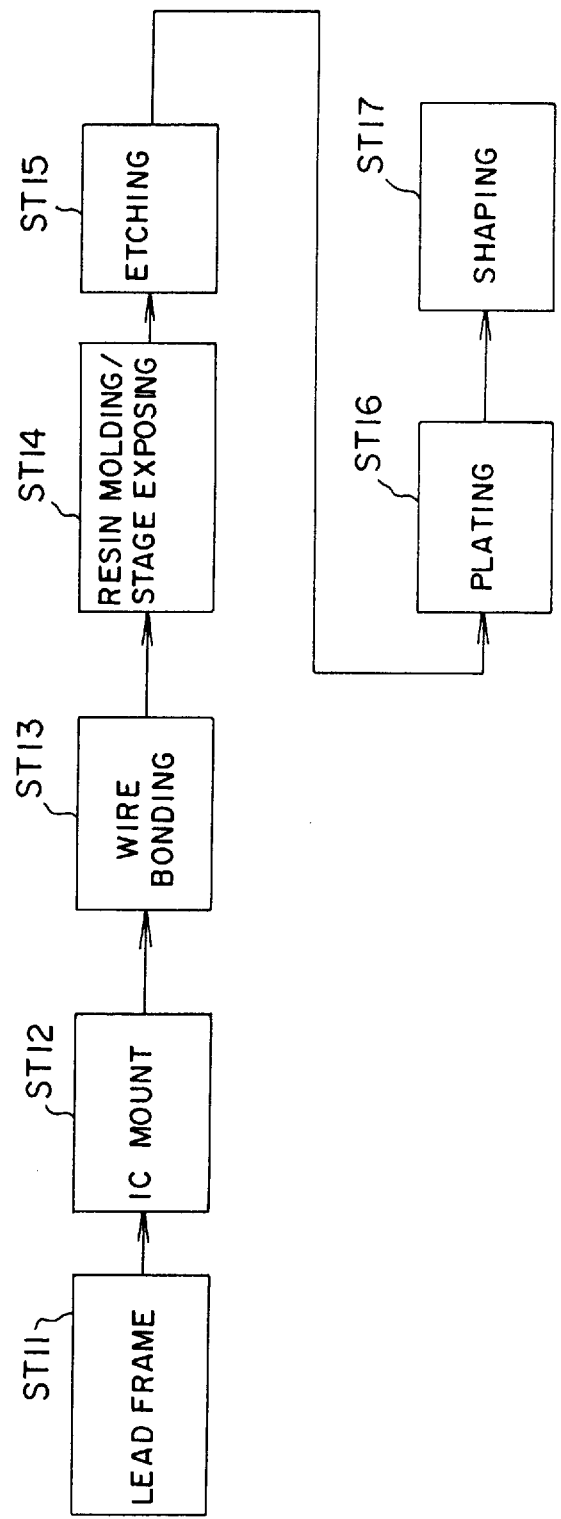

FIGS. 18A and 18B are diagrams of a method of producing the semiconductor device 251A according to the third embodiment of the present invention. More particularly, FIG. 18A shows a method of producing the lead frame 252, and FIG. 18B shows a production step using the lead frame 252.

In step ST1 shown in FIG. 18A, a metallic plate made of a Fe—Ni alloy or a Cu alloy is etched or pressed so that the stage 253 and the leads 257 are formed. In this step, the grooves 253d for defining the first through third areas 253a–253c shown in FIG. 17C are formed by a half-etching process. The grooves 253d are formed on the surface of the lead frame 252 on which the semiconductor chip 254 will be mounted in the future. When step ST1 is completed, the stage 253 is a one-body.

In step ST2, a plating process is performed in which the aforementioned SnNi protection film is coated on the outer leads 257b. Further, at least the end portions of the inner leads 253a and the chip-mounting-side surfaces of the second and third areas 253b and 253c are plated with a metallic film suitable for wire bonding, such as silver (Ag), gold (Au) or palladium (Pd).

In step ST3, the stage 253 of the lead frame 252 is recessed with respect to the other parts. In step ST4, a tape is applied to the end portions of the leads 253, and the end portions thereof are cut in step ST5. The tape is used to prevent deformation of the leads 253 which may occur at the time of cutting, and are removed after cutting.

In step ST12, the semiconductor chip 254 is mounted, by the adhesive 255, on the first area 253a of the stage 253 of the lead frame 252 formed by the process shown in FIG. 18A (step S1). In step ST13, a wire bonding step is performed so that the wires 258 connect the pads 254a on the semiconductor chip 254 to the second and third areas 253b and 253c and the inner leads 257a and connect the inner leads 257a to the second and third areas 253b and 253c. In step ST14, the assembly is set in a die for resin molding and a resin molding process is performed so as to form the package 259 from which the back surface of the stage 253 opposite to the surface on which the semiconductor chip 254 is mounted. Thereafter, a honing process is performed in which burrs of resin deposited in the periphery of the exposed surface of the stage 253 and on the outer leads 257b.

In step ST15, the back surface of the stage 253 exposed from the package 259 is removed by a chemical etching process until the half-etched grooves 253 appear. Thereby, as shown in FIG. 17C, the first, second and third areas 253a, 253b and 253c are completely separated from each other by the resin. In the above chemical etching process, the assembly is placed in an etchant. It will be noted that the outer leads 257b are plated with SnNi and the outer leads 257b are not etched. In step ST16, the outer leads 257b are plated with solder. In step ST17, the outer leads 257b are bent in the gull-wing shape.

By dividing the stage 253 into the first through third areas 253a–253c which function as the chip mounting area, the ground area and the power supply area, respectively, it becomes possible to reduce the wires extending from the semiconductor chip 254 and certainly perform wire bonding. Further, the wires 258 connecting the divided stage areas 253a–253c to the semiconductor chip 254 and the inner leads 257a can be shortened, so that noise superposed on the power supply system can be reduced and the electric characteristics can be improved.

Figure 19:
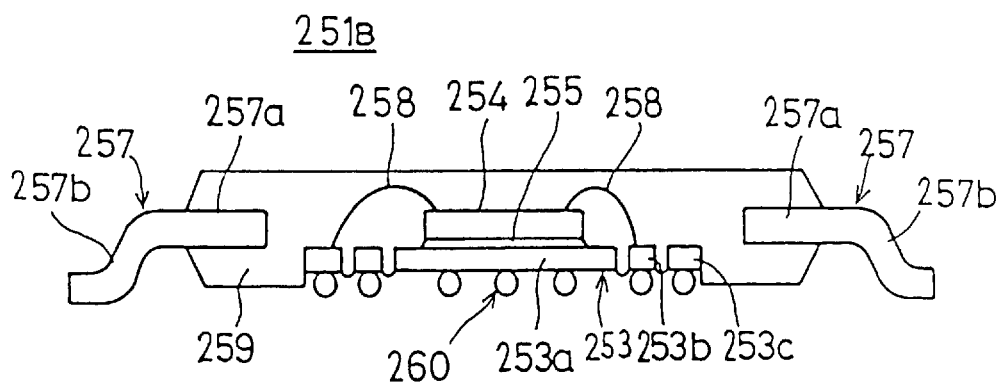
FIG. 19 is a cross-sectional view of a semiconductor device according to a first variation of the third embodiment of the present invention.

FIG. 19 shows a first variation 251B of the semiconductor device 251A shown in FIGS. 17A, 17B and 17C. In FIG. 19, parts that are the same as those shown in the previously described figures are given the same reference numbers as previously. A plurality of bump electrodes (made of solder or the like) 260 are formed on the back surfaces of the first through third areas 253a–253c. Hence, the wires connecting the second and third stages 253b and 253c to the inner leads 257a are not needed, so that the inductances of the power supply and ground lines can be further reduced.

The semiconductor device 251B is mounted on a printed circuit board so that the bump electrodes 260 are thermally melt and the areas 253a–253c are electrically connected to power-supply-system patterns (including a ground line) formed on the printed circuit board and that the outer leads 257b are soldered.

Figure 20:
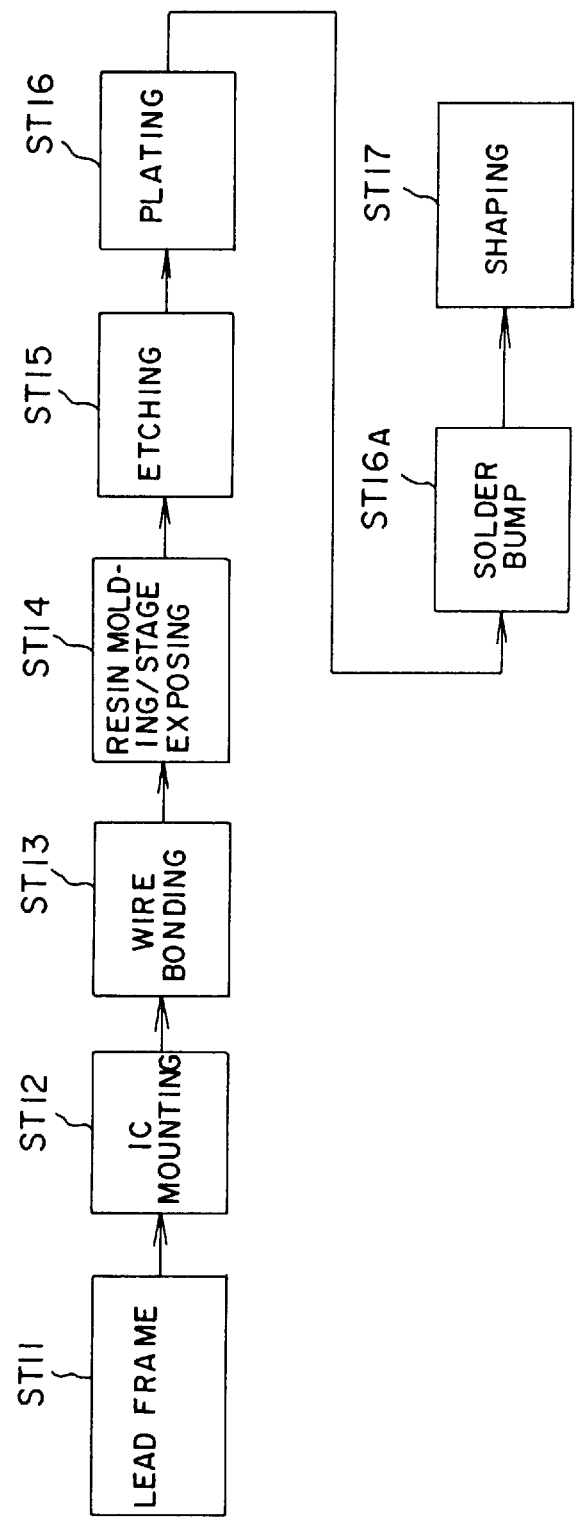
FIG. 20 is a diagram of a method of producing the semiconductor device shown in FIG. 19.

FIG. 20 is a diagram of a method of producing the semiconductor device 251B shown in FIG. 19. In FIG. 20, steps which are the same as those shown in FIGS. 18A and 18B are given the same reference numbers as previously, and a description thereof will be omitted. In step S13 shown in FIG. 20, only wires connecting the semiconductor chip 254 to the second and third stage areas 253b and 253c are provided because the semiconductor device 251B employs the bump electrodes 260. The bump electrodes 260 are provided in step ST16$_A$ subsequent to step ST16 in which the outer leads 257b are plated with solder. After step ST16$_A$, step S17 is performed.

Figure 21:
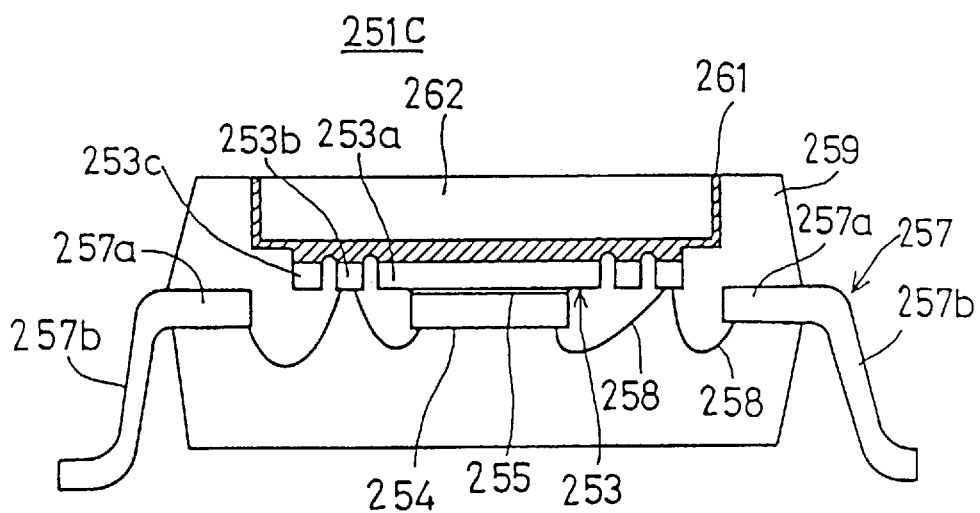
FIG. 21 is a cross-sectional view of a semiconductor device according to a second variation of the third embodiment of the present invention.

FIG. 21 shows a second variation 251C of the semiconductor device 251A. In FIG. 21, parts that are the same as those shown in the previously described figures are given the same reference numbers as previously. The outer leads 257b shown in FIG. 21 are bent in the direction reverse to the direction in which the outer leads 257b shown in FIG. 17A are bent. The main surface of the semiconductor chip 253 on which the pads are formed faces down. A heat radiating plate 262 is attached to the stage 253 (more precisely, the back surfaces of the first through third stage areas 253a–253c) by an adhesive 261. In the structure shown in FIG. 21, the package 259 is thicker than that shown in FIG. 17A in order to accommodate the heat radiating plate 262 so that the top surface of the heat radiating plate 262 and the top surface of the package are leveled. Alternatively, it is possible to attach the heat radiating plate to the semiconductor device 251A shown in FIG. 17A.

Figure 22:
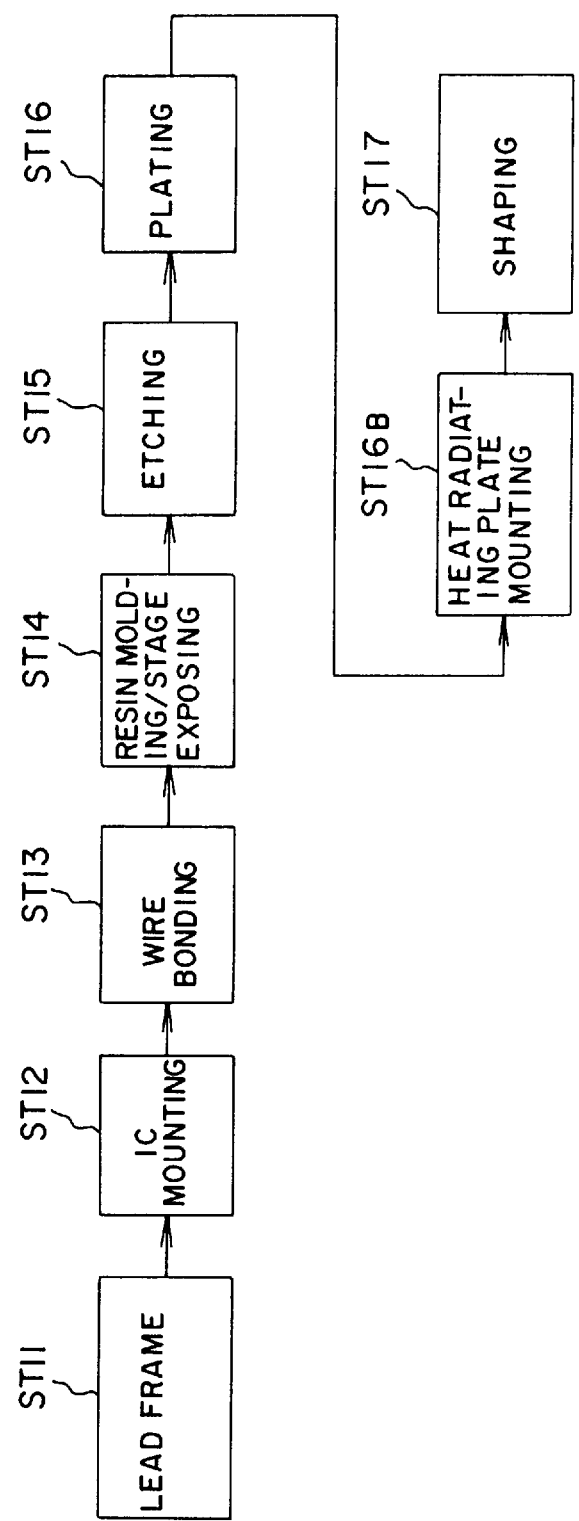
FIG. 22 is a diagram of a method of producing the semiconductor device shown in FIG. 21.

FIG. 22 is a diagram of a method of producing the semiconductor device 251C shown in FIG. 21. In FIG. 21, steps which are the same as those shown in FIGS. 18A and 18B are given the same reference numbers as previously, and a description thereof will be omitted. The heat radiating plate 262 is embedded in the package 259 in step ST16$_B$ subsequent to the plating step ST26. After step ST16B, the outer leads 257b are bent in step ST17. With use of the heat radiating plate 262, it becomes possible to efficiently radiate heat generated by the semiconductor device 254 which operates at high speed and further improve the reliability and the electric performance.

Figure 23:
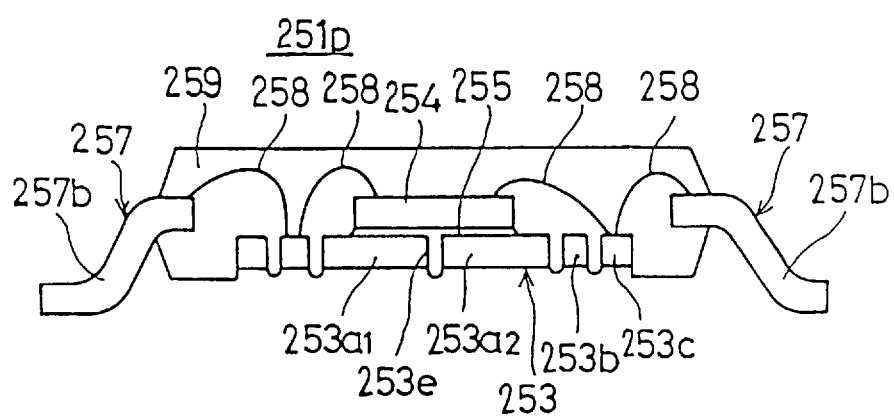
FIG. 23 is a cross-sectional view of a semiconductor device according to a third variation of the third embodiment of the present invention.

FIG. 23 shows a third variation 251D of the semiconductor device 251A. In FIG. 23, parts that are the same as those shown in the previously described figures are given the same reference numbers as previously. As shown in FIG. 23, the chip mounting area 253a of the stage 253 shown in FIG. 17A is divided into chip mounting areas 253a1 and 253a2. A groove 253e separates the chip mounting areas 253a1 and 253a2. The groove 253e can be formed by the half-etching process at the same time as the grooves 253d for defining the first, second and third stage areas 253a–253c. After the package 259 is formed, the back surface of the stage 253 is removed by etching until the grooves 253d and 253e appear. The third variation 251D has the same advantages as the semiconductor device 251A, and has an additional advantage in that the divided chip mounting areas 251a1 and 253a2 reduce stress applied to the semiconductor element 254 whereby flaking-off of the chip 254 and breaking and/or exposure of the wires 258 due to a deformation of the stage can be prevented.

Figure 24A:
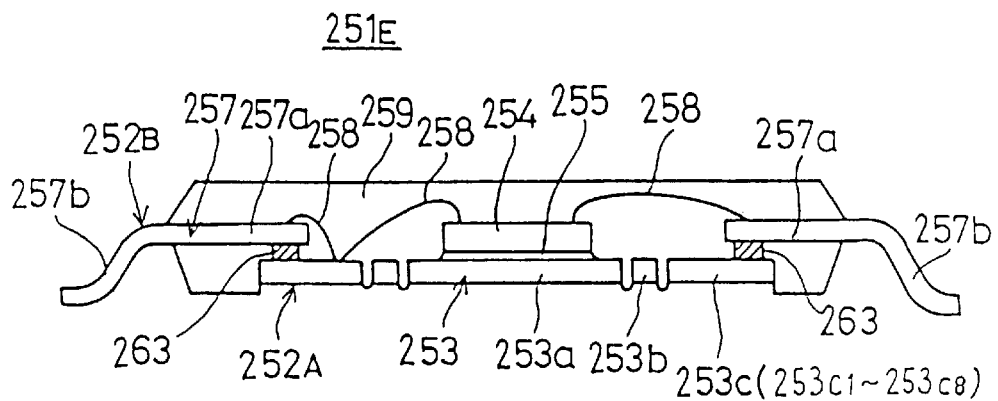
FIG. 24A is a cross-sectional view of a semiconductor device according to a fourth embodiment of the present invention.
Figure 24B:
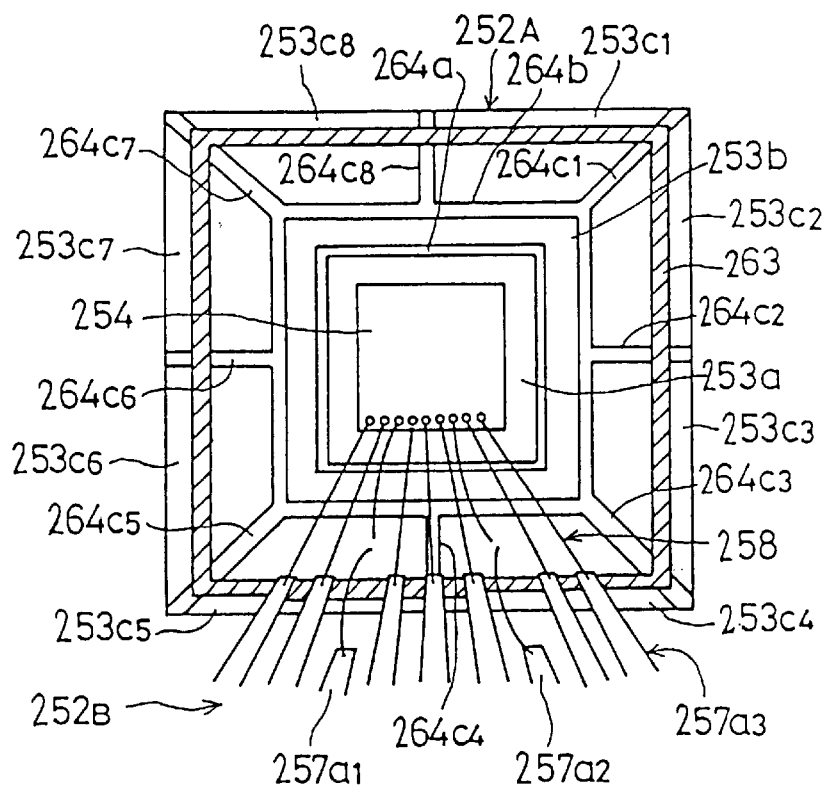
FIG. 24B is a plan view of the semiconductor device shown in FIG. 24A in which a package shown in FIG. 24A has been removed.

A description will now be given, with reference to FIGS. 24A and 24B, of a semiconductor device 251E according to a fourth embodiment of the present invention. In FIGS. 24A and 24B, parts that are the same as those shown in the previously described figures are given the same reference numbers as previously. The semiconductor device 251E has an essential feature in which the lead frame 252 includes a stage-part frame 252A and a lead-part frame 252B, the frames 252A and 252B partially overlapping so that a multi-layer frame structure is formed, as shown in FIG. 24A. The stage-part frame 252A has the stage 253, and the lead-part frame 252B having the leads 257 having the inner leads 257a and the outer leads 257b.

The stage 253 of the stage-part frame 252A is divided into the first through third areas 253a–253c. The third area 253c is located around the second area 253b, and is divided into eight areas 253c1–253c8. The semiconductor chip 254 is mounted on the first area 253a by the adhesive 255. For example, the second area 253a is used as a ground layer, and the areas 253c1–253c8 of the third area 253c are used so that a power supply layer and a ground area are alternately arranged. An insulating adhesive tape 263 formed in a ring is provided to the areas 253c1–253c8 of the third stage area 253c.

Signal-system inner leads 257a3 out of the inner leads 257a extend to the stage 253 (more precisely, the areas 253c1–253c8), and are connected to and fixed to the insulating adhesive tape 263. The inner leads 257a1 and 257a2 functioning as the power supply lines and the ground lines, respectively extend to the vicinity of the stage 253. The stage-part frame 252A and the lead-part frame 252B partially overlap with each other.

The wires 258 make electric connections between the pads 254a on the semiconductor chip 254 and the inner leads 257a (257a1–257a3), between the pads 254a and the second area 253b, and between the pads 254a and the areas 253c1–253c8. The package 259 is formed by molding resin so that the back surfaces of the first and second areas 253a and 253b and the areas 253c1–253c8 of the third area 253c are exposed from the package 259. The outer leads 257b extending from the package 259 are bent in the gull-wing shape.

Figure 25:
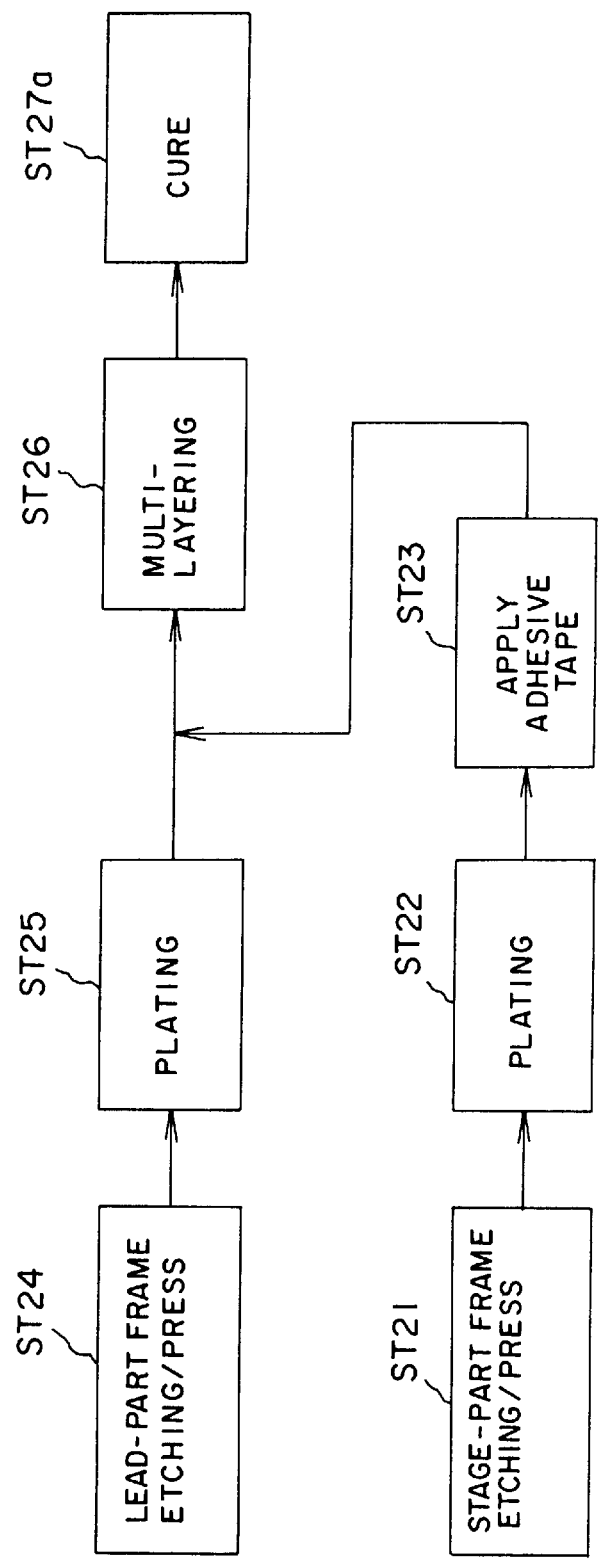
FIG. 25 is a diagram of a method of producing the semiconductor device shown in FIGS. 24A and 24B.

FIG. 25 is a diagram of a method of producing the lead frame shown in FIGS. 24A and 24B. In step ST21, the stage 253 is formed by etching or pressing the stage-part frame 252A, and the grooves 264a and 264B (FIG. 24B) defining the first and second areas 253a and 253b and the grooves 264c1–264c8 defining the areas 253c1–253c8 are formed on the chip-mounting-side surface of the stage 253 by the half-etching process. The grooves 264a, 264b and 264c1–264c8 completely separate the stage areas from each other, as shown in FIGS. 24A and 24B.

It may be possible to form slits corresponding to the grooves 264c1–264c8 on the back surface of the stage area 253c by the half-etching process. In this case, the etching process performed after the package 259 is formed can be carried out for only the first and second areas 253a and 253b.

In step ST22, at least the second area 253b and the areas 253c1–253c8 of the third area 253c are plated with a metallic material such as Ag, Au or Pd in order to improve bondability. In step ST23, the insulating adhesive tape 63 formed in a ring is applied to the areas 253c1–253c8 of the third stage 253. In step ST24, the lead-part frame 252B is etched or pressed so that a predetermined number of inner leads 257a and a predetermined number of outer leads 257b. In this case, the inner leads 257a1 and 257a2 respectively functioning as the power supply line and the ground line are arranged in the vicinity of the stage 253. The inner leads 257a3 serving as signal lines are arranged above the areas 253c1–253c8.

In step ST25, the end portions of the inner leads 257a1–257a8 are plated with Ag, Au or Pd. The portions corresponding to the outer leads 257b are plated with SnNi in order to improve the anti-etching performance. In step ST26, the stage-part frame 252A and the lead-part frame 252B are stacked so that the end portions of the signal-system inner leads 257a3 adhere to the top of the insulating adhesive tape 263. In step ST27, the insulating adhesive tape 265 is cured whereby the inner leads 257a3 are fixed to the insulating adhesive tape 265. Then, by using the lead frame 252 thus formed, the semiconductor device 251E is produced in the same manner as shown in FIG. 18B.

The wires and leads can be reduced so that the inductances of the power supply system including the power supply and ground lines can be reduced. Further, the power supply lines and the ground lines can be formed by the areas 253c1–253c8 of the third stage area 253 rather than a specific formation of the stage. Hence, the inductances of the power supply line and the ground lines can be reduced so that the electric characteristics of the semiconductor device can be improved.

Figure 26:
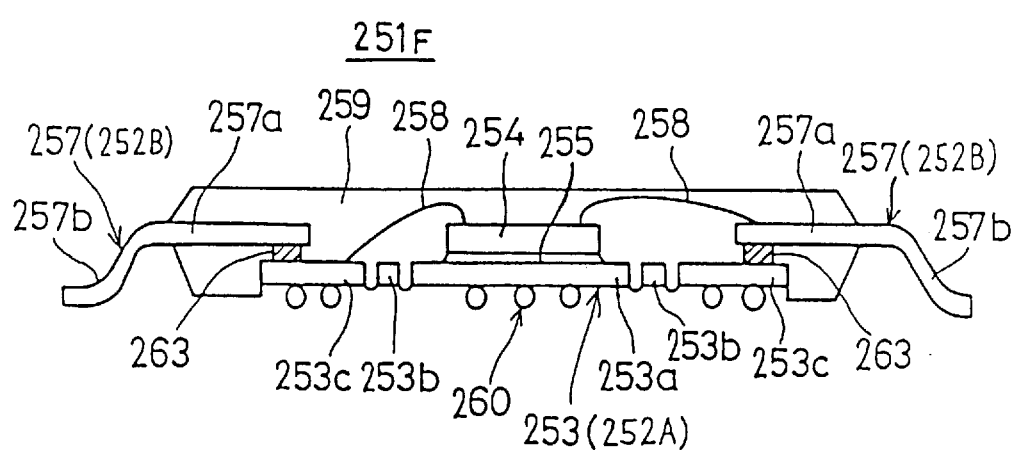
FIG. 26 is a cross-sectional view of a semiconductor device according to a first variation of the fourth embodiment of the present invention.

FIG. 26 shows a first variation 251F of the semiconductor device 251E shown in FIGS. 24A and 24B. In FIG. 26, parts that are the same as those shown in FIGS. 24A and 24B. The semiconductor device 251F includes bump electrodes 260 made of solder are provided on the back surfaces of the first and the second areas 253a and 253b and the areas 253c1–253c8 of the third area. The method of producing the semiconductor device 251F is almost the same as that of the semiconductor device 215B shown in FIG. 19. The wires connecting the inner leads 257a1 and 257a2 to the power supply line and the ground line (the first and second areas 253a and 253b) can be omitted. Further, it is possible to electrically connect the power supply line and the ground line to a printed circuit board on which the semiconductor device 251F is mounted without the external leads 257b. Hence, the inductances of the power supply and ground lines can be reduced whereby the electric characteristics of the semiconductor device 251F can be improved.

Figure 27A:
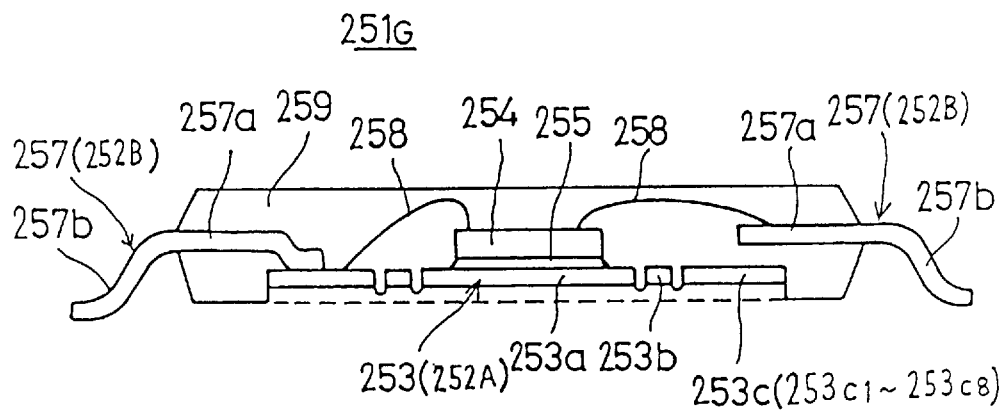
FIG. 27A is a cross-sectional view of a semiconductor device according to a second variation of the fourth embodiment of the present invention.
Figure 27B:
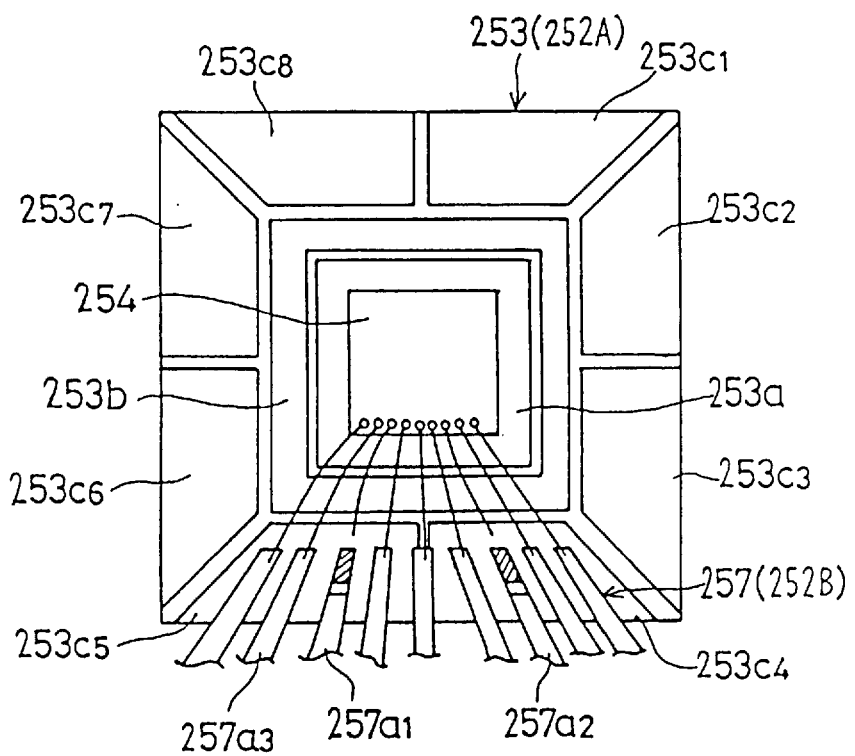
FIG. 27B is a plan view of the semiconductor device shown in FIG. 27A in which a package shown in FIG. 27 has been removed.

FIGS. 27A and 27B show a second variation 251G of the semiconductor device 251E shown in FIGS. 24A and 24B. In FIGS. 27A and 27B, parts that are the same as those shown in FIGS. 27A and 27B are given the same reference numbers as previously. The semiconductor device 251G does not have the insulating adhesive tape 263. The inner leads 257a1 and 257a2 extend to the areas 253c1–253c8 of the third area as in the case of the inner leads 257a3, and have end portions formed in an L shape. The end portions of the inner leads 257a1 and 257a2 are directly in contact with the areas 253c–253c8 and are fixed thereto by welding. The other parts of the semiconductor device 251G are the same as those shown in the semiconductor device shown in FIGS. 24A and 24B.

According to the structure shown in FIGS. 27A and 27B, the wires connecting the inner leads 257a1 and 257a2 to the areas 253c–253c8 can be omitted so that the electric characteristics of the device 251F can be improved due to reduction in the inductances of the power supply and ground lines. Further, the insulating adhesive tape 263 is not needed, and hence the curing step (step ST27a shown in FIG. 25) is not needed. Hence, the production cost can be reduced.

FIG. 28 is a diagram of a method of producing the semiconductor device 251G shown in FIGS. 27A and 27B. In FIG. 28, parts that are the same as those shown in FIG. 25 are given the same reference numbers. After the plating step ST25 for the lead-part frame 252B, a tape is attached to the inner leads 257a in step ST25a. In step ST25b, the end portions of the leads 257a are cut and shaped in an L shape. In step ST26, the stage-part frame 252A is made to overlap the lead-part frame 252 in the state in which the insulating adhesive tape is attached on the stage 253 of the stage-part frame 252A. In this step, the L-shaped end portions of the inner leads 257a1 and 257a2 come into contact with the top surfaces of the areas 253c–253c8. In step ST27b, the contact parts are welded so that the end portions of the inner leads 257a1 and 257a2 are fixed to the top surfaces of the areas 253c–253c8.

The first area 253a of the stage 253 in each of the semiconductor devices 251E, 251F and 251G can be divided in the same manner as the first area 253a in the semiconductor device 251D shown in FIG. 23. The aforementioned advantage resulting from the division of the first area 253a can be obtained. It is also possible to mount the heat radiating plate 262 on the back surface of the stage 253 (more particularly, the back surfaces of the first and second areas 253a and 253b and the areas 253c–253c8 of the third area 253c) by the adhesive 261 in the same manner as shown in FIGS. 21 and 22. The aforementioned advantage resulting from use of the heat radiating plate 262 can be obtained.

The aforementioned semiconductor devices 251A 251G use the plastic packages. A description will now be given, with reference to FIG. 29, of a semiconductor device 271A using a ceramic package according to a fifth embodiment of the present invention.

Figure 29:
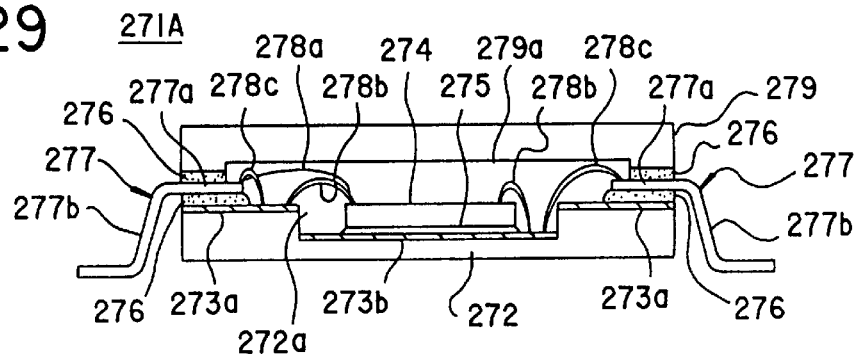
FIG. 29 is a cross-sectional view of a semiconductor device according to a fifth embodiment of the present invention.

The semiconductor device 271A shown in FIG. 29 has the two-layer Cerquad structure of the surface-mounting type QFP. A base 272 is made of a ceramic material such as aluminum nitride (AlN), and has a recess portion 272a. A metallic film 273a made of, for example, aluminum is deposited on the upper surface of the base 272, and a metallic film 273b made of, for example, aluminum is formed on the bottom surface of the recess portion 272a. These metallic films 273a and 273b are deposited by the thick-film printing process or the mask evaporation process. The metallic films 273a and 273b are used as a power supply layer and a ground layer, respectively. A semiconductor chip 274 is mounted on and fixed to the center of the metallic film 273b provided in the recess portion 272a by an adhesive 275 such as Al—Si eutectic or Ag glass.

A refractory-glass layer 276 is formed around the metallic film 273a formed on the base 272. Inner leads 277a of a lead frame 277 having, for example, 164 pins are mounted on and supported by the refractory-glass layer 276. The lead frame 277 includes outer leads 277b extending from the package, and the inner leads 277b extending in the package, and includes signal-system leads and power-supply-system leads. The lead frame 277 is formed of a Fe—Ni alloy or a Cu alloy, and opposite portions thereof sealed by the refractory-glass layer 276 and opposite portions to which wires are bonded are plated with a metallic film made of, for example, aluminum. As will be described later, the above plating improves the performance of adhesion between aluminum and the refractory-glass layer 276.

On the semiconductor chip 274, provided are pads for the signal system and pads for the power supply system. Metallic wires 278a made of, for example, aluminum, are bonded to connect the inner leads 277a of the lead frame 277 and the pads for the signal system. The metallic wires 278a have a diameter of, for example, 30 μm. One or a plurality of metallic wires 278b are bonded to connect pads for the power supply system and the metallic films 273a and 273b. When a single metallic wire is used, it is preferable that the single metallic wire has a diameter corresponding to the sum of the diameters of a plurality of metallic wires 278b. The inner leads 277a are connected to the metallic films 273a and 273b by means of a single or a plurality of wires 278c. The thick or thin metallic films 273a and 273b formed on the base 272 enables wire bonding, and the performance of bonding the wires 278a and 278c is facilitated by depositing aluminum films on portions of the inner leads 277a to be bonded. The outermost peripheral portions of the inner leads 277a are coated with the refractory-glass 276, on which a cap 279 made of a ceramic material such as alumina or mullite is mounted so that the semiconductor chip 274 is hermetically sealed by the cap 279 having a recess portion 279a.

As described above, it is not necessary to divide the metallic film on the same plane by forming the metallic films 273a and 273b on the base 272 and the bottom surface of the recess portion 272a Further, a multi-layer base is not needed and the bonding positions are not limited. Hence, the production cost can be reduced. Furthermore, the inductance of the power supply system can be reduced and the capacity can be increased so that the electric characteristics of the semiconductor device 271A can be improved.

Figure 30A:
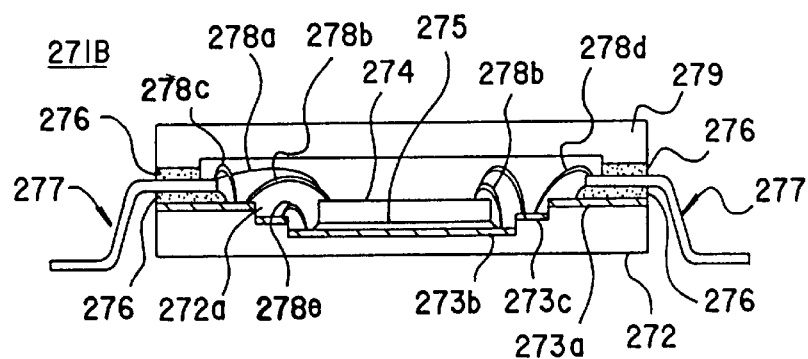
FIG. 30A is a cross-sectional view of a variation of the fifth embodiment of the present invention.
Figure 30B:
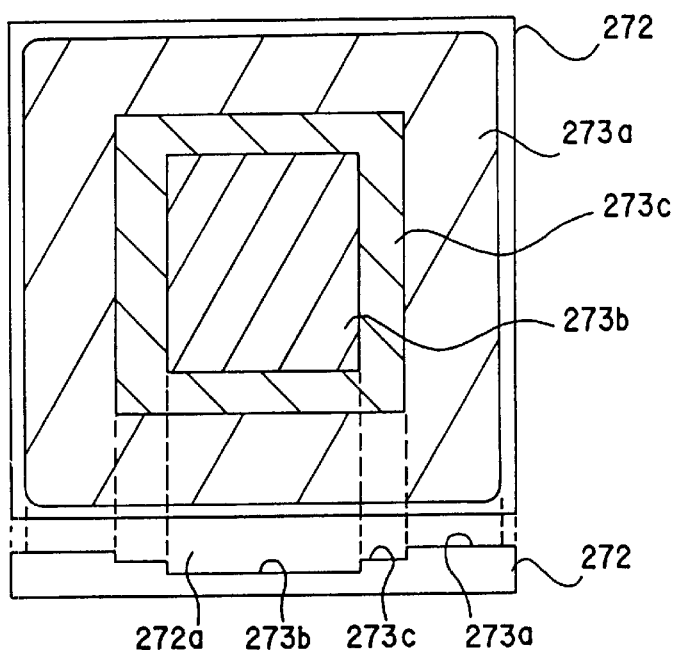
FIG. 30B is a plan view of the semiconductor device shown in FIG. 30A in which a cap has been removed.

FIGS. 30A and 30B show a variation 271B of the semiconductor device 271A. In FIGS. 30A and 30B, parts that are the same as those shown in FIG. 29 are given the same reference numbers. The recess portion 272a of the base 272 of the semiconductor device 271B has two steps of the bottom surface and an intermediate surface. A metallic film 273c made of, for example, aluminum is formed on the intermediate surface of the recess portion 272a. The metallic film 273c is connected to the pads on the semiconductor chip 274 and the other metallic film 273a and 273b by means of a plurality of bonding wires 278d and 278e or a single wire of a diameter corresponding to the sum of the diameters of the plurality of wires. The semiconductor device 271B has the same advantages as the semiconductor device 271A.

The present invention is not limited to the specifically embodiments and variations, and other variations and modifications may be made without departing from the scope of the present invention.

What is claimed is:

1. A method of producing a semiconductor device, comprising the steps of:

(a) mounting a semiconductor chip on a first surface of a stage of a lead frame, said first surface having grooves formed thereupon, said grooves dividing the stage into a plurality of areas, (b) establishing electrical connections between the semiconductor chip, the stage and the leads;

(c) forming a package which seals the semiconductor chip;

(d) removing a surface of the package so that a second surface of the stage, opposite to the first surface, appears so that the plurality of areas of the stage are separated from each other.

2. The method as claimed in claim 1, further comprising the step (e) of plating outer lead portions of the leads with a metallic film.

3. The method as claimed in claim 1, further comprising the step (e) of forming bump electrodes on the second surface of the stage.

4. The method as claimed in claim 1, further comprising the step (e) of attaching a heat radiating member to the second surface of the stage.

* * * * *